United States Patent
Liu

(10) Patent No.: US 12,148,705 B2
(45) Date of Patent: Nov. 19, 2024

(54) METHODS FOR FORMING SEMICONDUCTOR DEVICES BONDED BY INTERPOSER STRUCTURE

(71) Applicant: YANGTZE MEMORY TECHNOLOGIES CO., LTD., Wuhan (CN)

(72) Inventor: Jun Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 534 days.

(21) Appl. No.: 17/336,214

(22) Filed: Jun. 1, 2021

(65) Prior Publication Data

US 2021/0296302 A1 Sep. 23, 2021

Related U.S. Application Data

(60) Division of application No. 16/727,869, filed on Dec. 26, 2019, now Pat. No. 11,605,593, which is a
(Continued)

(51) Int. Cl.
*H01L 23/538* (2006.01)
*H01L 23/498* (2006.01)
(Continued)

(52) U.S. Cl.
CPC .... *H01L 23/5383* (2013.01); *H01L 23/49811* (2013.01); *H01L 23/49822* (2013.01);
(Continued)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS 10,304,852 B1 5/2019 Cui et al.
10,354,980 B1 7/2019 Mushiga et al.
(Continued)

FOREIGN PATENT DOCUMENTS

CN 107658317 A 2/2018
CN 109075170 A 12/2018
(Continued)

OTHER PUBLICATIONS

International Search Report issued in corresponding International Application No. PCT/CN2019/110708, mailed Jul. 9, 2020, 4 pages.

*Primary Examiner* — Didarul A Mazumder
*Assistant Examiner* — Gustavo G Ramallo
(74) *Attorney, Agent, or Firm* — BAYES PLLC

(57) ABSTRACT

A method for forming a three-dimensional (3D) memory device includes the following operations. First, in a first semiconductor structure, logic process-compatible devices and first bonding contacts are formed conductively connected to the logic process-compatible devices. In a second semiconductor structure, an array of NAND memory cells and second bonding contacts are formed conductively connected to the array of NAND memory cells. A first surface of an interposer structure is bonded to the second semiconductor structure. First interposer contacts disposed at the first surface of the interposer structure are conductively connected to the second bonding contacts. A second surface of the interposer structure is bonded to the first semiconductor structure. Second interposer contacts disposed at the second surface of the interposer structure are conductively connected to the first bonding contacts. The interposer structure is attached to the first semiconductor structure and the second semiconductor structure.

20 Claims, 14 Drawing Sheets

Related U.S. Application Data continuation of application No. PCT/CN2019/110708, filed on Oct. 12, 2019.

(51) Int. Cl.
  *H10B 41/27* (2023.01)
  *H10B 41/35* (2023.01)
  *H10B 41/41* (2023.01)
  *H10B 43/27* (2023.01)
  *H10B 43/35* (2023.01)
  *H10B 43/40* (2023.01)

(52) U.S. Cl.
  CPC .... *H01L 23/49838* (2013.01); *H01L 23/5386* (2013.01); *H10B 41/27* (2023.02); *H10B 41/35* (2023.02); *H10B 41/41* (2023.02); *H10B 43/27* (2023.02); *H10B 43/35* (2023.02); *H10B 43/40* (2023.02)

(58) Field of Classification Search
  CPC ........ H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
  See application file for complete search history.

(56) References Cited

U.S. PATENT DOCUMENTS

| | | |
|---|---|---|
| 10,354,987 B1 | 7/2019 | Mushiga et al. |
| 2014/0217495 A1 | 8/2014 | Nutte et al. |
| 2015/0236038 A1* | 8/2015 | Pachamuthu ....... H01L 27/0688 257/326 |
| 2016/0079164 A1 | 3/2016 | Fukuzumi et al. |
| 2016/0358865 A1 | 12/2016 | Shih et al. |
| 2018/0102470 A1 | 4/2018 | Das et al. |
| 2019/0081069 A1* | 3/2019 | Lu .......................... H10B 43/50 |
| 2019/0088589 A1 | 3/2019 | Zhu et al. |
| 2019/0237438 A1 | 8/2019 | Yoo et al. |
| 2020/0286905 A1* | 9/2020 | Kai ....................... H10B 43/27 |
| 2021/0232744 A1* | 7/2021 | Lin .................. H03K 3/356113 |

FOREIGN PATENT DOCUMENTS

| | | |
|---|---|---|
| CN | 109712989 A | 5/2019 |
| CN | 110249427 A | 9/2019 |
| CN | 110291361 A | 9/2019 |
| TW | 201630084 A | 8/2016 |
| TW | 201826448 A | 7/2018 |
| TW | 201913966 A | 4/2019 |
| TW | 201933573 A | 8/2019 |
| TW | 201939705 A | 10/2019 |

* cited by examiner

300

500

METHODS FOR FORMING SEMICONDUCTOR DEVICES BONDED BY INTERPOSER STRUCTURE

CROSS-REFERENCE TO RELATED APPLICATIONS

This application is a division of U.S. application Ser. No. 16/727,869, filed on Dec. 26, 2019, entitled "SEMICONDUCTOR DEVICES HAVING INTERPOSER STRUCTURE AND METHODS FOR FORMING THE SAME," which is a continuation of International Application No. PCT/CN2019/110708, filed on Oct. 12, 2019, entitled "SEMICONDUCTOR DEVICES HAVING INTERPOSER STRUCTURE AND METHODS FOR FORMING THE SAME," both of which are hereby incorporated by reference in their entireties.

BACKGROUND

Embodiments of the present disclosure relate to three-dimensional (3D) semiconductor devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of semiconductor devices and fabrication methods thereof are disclosed herein.

In one example, a semiconductor device includes a first semiconductor structure, a second semiconductor structure, and an interposer structure vertically between the first and second semiconductor structures. The first semiconductor structure includes a plurality of logic process-compatible devices and a first bonding layer comprising a plurality of first bonding contacts. The second semiconductor structure includes an array of NAND memory cells and a second bonding layer comprising a plurality of second bonding contacts. The interposer structure includes a first interposer bonding layer having a plurality of first interposer contacts disposed at a first side of the interposer structure, and a second interposer bonding layer having a plurality of second interposer contacts disposed at a second side opposite of the first side of the interposer structure. The plurality of first interposer contacts is conductively connected to the plurality of second interposer contacts. The interposer structure is attached to the first semiconductor structure through the first interposer bonding layer and is conductively connected to the first semiconductor structure through the first bonding contacts and the first interposer contacts. The interposer structure is attached to the second semiconductor structure through the second interposer bonding layer and is conductively connected to the second semiconductor structure through the second bonding contacts and second interposer contacts.

In another example, a semiconductor device includes a first semiconductor structure, a second semiconductor structure, and an interposer structure. The first semiconductor structure includes a first device layer and a first bonding layer comprising a plurality of first bonding contacts. The second semiconductor structure includes a second device layer and a second bonding layer comprising a plurality of second bonding contacts. The interposer structure includes a redistribution layer, a first interposer bonding layer, and a second interposer bonding layer. The redistribution layer includes a plurality of conductive routings distributed in one or more levels. The first interposer bonding layer includes a plurality of first interposer contacts disposed at a first side of the redistribution layer. The second interposer bonding layer includes a plurality of second interposer contacts disposed at a second side opposite of the first side of the redistribution layer. The first interposer contacts is conductively connected to the second interposer contacts through the conductive routings. The interposer structure is attached to the first semiconductor structure through the first interposer bonding layer and is conductively connected to the first semiconductor structure through the first bonding contacts and the first interposer contacts. The interposer structure is attached to the second semiconductor structure through the second interposer bonding layer and is conductively connected to the second semiconductor structure through the second bonding contacts and the second interposer contacts.

In still another example, a method for forming a 3D memory devices includes the following operations. First, in a first semiconductor structure, a plurality of logic process-compatible devices and a plurality of first bonding contacts are formed conductively connected to the plurality of logic process-compatible devices. In a second semiconductor structure, an array of NAND memory cells and a plurality of second bonding contacts are formed conductively connected to the array of NAND memory cells. A first surface of an interposer structure is bonded to the second semiconductor structure. A plurality of first interposer contacts disposed at the first surface of the interposer structure are conductively connected to the plurality of second bonding contacts. A second surface of the interposer structure is bonded to the first semiconductor structure. A plurality of second interposer contacts disposed at the second surface of the interposer structure are conductively connected to the plurality of first bonding contacts. The interposer structure is attached to the first semiconductor structure and the second semiconductor structure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
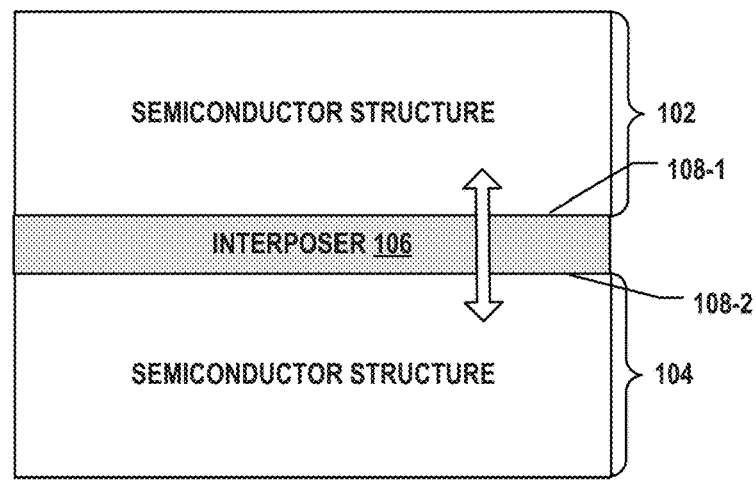
FIG. 1 illustrates a schematic view of a cross-section of an exemplary semiconductor device, according to some embodiments.
Figure 1:
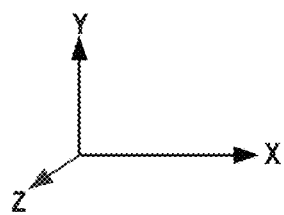

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiments. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "three-dimensional (3D) NAND memory string" refers to a vertically-oriented string of memory cell transistors connected in series on a laterally-oriented substrate so that the string of memory cell transistors extends in the vertical direction with respect to the substrate. As used herein, the term "vertical/vertically" means nominally perpendicular to the lateral surface of a substrate.

As 3D NAND memory devices continue to scale up vertically (e.g., having 96-layers or more), it may not be feasible to enable one-step etching of high aspect ratio structures, such as channel holes and gate line slits (GLSs), due to dry etching challenges. Especially, for small-size patterns like channel holes, critical dimension (CD) control and further reduction would benefit cell density increase.

Direct bonding technologies have been proposed to fabricate some 3D NAND memory devices (e.g., having 96-layers or more) by joining peripheral device and memory array on different substrates. However, direct bonding processes may have limitations such as not sufficient bonding strength due to wafer warpage and/or stress. Other drawbacks include the extra cost to form additional features (e.g., metal layers) used for bonding and high precision required for the lithography alignment.

Various embodiments in accordance with the present disclosure provide semiconductor devices, e.g., 3D NAND memory devices, formed by the joining of a pair of semiconductor structures with an interposer structure, rather than direct bonding. The semiconductor device can have improved bonding strength and lower cost. The 3D semiconductor devices disclosed herein can achieve better critical dimension (CD) control and more relaxed lithograph alignment/overlay specification during fabrication, thereby reducing cost and increasing production yield and throughput. The semiconductor devices can also provide buffer/compensation for wafer bow, facilitating easier bonding between the bonded semiconductor structures.

In the present disclosure, the interposer structure includes an interposer bonding layer with interposer contacts on each side that is in contact with a semiconductor structure. Electrical connections can be formed between the interposer contacts and the bonding contacts of the respective semiconductor structure. The interposer structure can include material(s) with desired adhesion strength to bond the semiconductor structures together firmly during the subsequent fabrication processes, improving the bonding strength between the semiconductor structures. The material(s) of the interposer structure can have sufficient elasticity to adjust its shape to any deformation of the semiconductor structures, e.g., deformation caused by wafer bow or the fabrication process, so the bonding strength and the electrical connection between the semiconductor structures can be maintained. The material of the interposer structure can include inexpensive materials such as adhesive polymer (e.g., epoxy).

Also, the sizes and distribution of the interposer contacts may provide improved flexibility for the semiconductor structures to be aligned and bonded. For example, the lateral dimensions of the interposer contacts can be optimized, e.g., slightly less than the bonding contact it is conductively connected, to increase the alignment tolerance while maintaining sufficiently low resistance. The interposer structure may also include a redistribution layer between and conductively connected to the interposer contacts on both sides. The redistribution layer may include conductive routings distributed in one or more levels/layers to flexibly route the electrical connection between the bonded semiconductor structures. The bonding and electrical connection in the semiconductor device can thus be optimized and are less impacted by the positions of the bonding contacts of the bonded semiconductor structure. The 3D NAND memory devices disclosed herein can thus achieve better CD control and more relaxed lithograph alignment/overlay specification during fabrication, thereby reducing cost and increasing production yield and throughput.

FIG. 1 illustrates a schematic view of a cross-section of an exemplary semiconductor device 100, according to some embodiments. Semiconductor device 100 represents an example of a semiconductor device formed by the bonding of a pair of semiconductor structures with an interposer structure. The components of semiconductor device 100 (e.g., logic process-compatible devices and NAND memory) can be formed separately on different substrates and then joined to form a bonded chip/device. Semiconductor device 100 can include semiconductor structures 102 and 104 bonded by an interposer structure 106. Data/electric signals may transfer between semiconductor structures 102 and 104. In some embodiments, semiconductor structure 102 including a plurality of logic process-compatible devices. In some embodiments, the logic process-compatible devices in semiconductor structure 102 include any semiconductor device that can be fabricated in a way that is comparable to the fabrication processes for logic devices. For example, the logic process-compatible devices may include processors, controllers, random-access memory (RAM) (e.g., dynamic RAM (DRAM) or static (SRAM)), and peripheral circuits of memory devices. In some embodiments, the logic process-compatible devices include a processor, an array of RAM cells, and a peripheral circuit for an array of NAND memory cells (e.g., included in semiconductor structure 104). In some embodiments, the logic process-compatible devices are formed using complementary metal-oxide-semiconductor (CMOS) technology. Both the processor and the array of RAM cells can be implemented with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.) to achieve high speed.

The processor can include a specialized processor including, but not limited to, CPU, GPU, digital signal processor (DSP), tensor processing unit (TPU), vision processing unit (VPU), neural processing unit (NPU), synergistic processing unit (SPU), physics processing unit (PPU), and image signal processor (ISP). The processor can also include a silicon-on-chip (SoC) that combines multiple specialized processors, such as an application processor, baseband processor, and so on. In some embodiments in which semiconductor device 100 is used in mobile devices (e.g., smartphones, tablets, eyeglasses, wrist watches, virtual reality/augmented reality headsets, laptop computers, etc.), an application processor handles applications running in an operating system environment, and a baseband processor handles the cellular communications, such as the second-generation (2G), the third-generation (3G), the fourth-generation (4G), the fifth-generation (5G), the sixth-generation (6G) cellular communications, and so on.

Other processing units (also known as "logic circuits") besides the processor can be formed in semiconductor structure 102 as well, such as one or more controllers and/or the entirety or part of the peripheral circuits of a NAND memory of semiconductor structure 104. A controller can handle a specific operation in an embedded system. In some embodiments in which semiconductor device 100 is used in mobile devices, each controller can handle a specific operation of the mobile device, for example, communications other than cellular communication (e.g., Bluetooth communication, Wi-Fi communication, frequency modulation (FM) radio, etc.), power management, display drive, positioning and navigation, touch screen, camera, etc. Semiconductor structure 102 of semiconductor device 100 thus can further include a Bluetooth controller, a Wi-Fi controller, a FM radio controller, a power controller, a display controller, a global positioning system (GPS) controller, a touch screen controller, a camera controller, to name a few, each of which is configured to control operations of the corresponding component in a mobile device.

In some embodiments, first semiconductor structure 202 of semiconductor device 100 further includes the entirety or part the peripheral circuits of the NAND memory of semiconductor structure 104. The peripheral circuit (also known as control and sensing circuits) can include any suitable digital, analog, and/or mixed-signal circuits used for facilitating the operations of the NAND memory. For example, the peripheral circuit can include one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors).

The RAM is integrated on the same substrate of the logic circuits (e.g., the processor and peripheral circuits), allowing wider bus and higher operation speed, which is also known as "on-die RAM." The RAM may include DRAM and/or SRAM. The memory controller of the RAM can be embedded as part of the peripheral circuits. In some embodiments, each SRAM cell includes a plurality of transistors for storing a bit of data as a positive or negative electrical charge as well as one or more transistors that control access to it. In one example, each SRAM cell has six transistors (e.g., metal-oxide-semiconductor field-effect transistors (MOSFETs)), for example, four transistors for storing a bit of data and two transistors for controlling access to the data. The SRAM cells can locate in the area that is not occupied by the logic circuits (e.g., the processor and peripheral circuits) and thus, do not need extra space to be formed. In one example, each DRAM cell includes a capacitor for storing a bit of data as a positive or negative electrical charge as well as one or more transistors that control access to it. For example, each DRAM cell may be a one-transistor, one-capacitor (1T1C) cell. The on-die RAM (e.g., on-die DRAM and/or SRAM) can enable high-speed operations of semiconductor device 100, used as one or more caches (e.g., instruction cache or data cache) and/or data buffers.

Semiconductor structure 104 may include an array of NAND memory cells. That is, semiconductor structure 104 can be a NAND flash memory device in which memory cells are provided in the form of an array of 3D NAND memory strings and/or an array of two-dimensional (2D) NAND memory cells. NAND memory cells can be organized into pages which are then organized into blocks in which each NAND memory cell is electrically connected to a separate line called a bit line (BL). All cells with the same vertical position in the NAND memory cell can be electrically connected through the control gates by a word line (WL). In some embodiments, a plane contains a certain number of blocks that are electrically connected through the same bit line. Semiconductor structure 104 can include one or more planes, and the peripheral circuits that are needed to perform all the read/write/erase operations can be included in semiconductor structures 102 and/or 104.

In some embodiments, the array of NAND memory cells are an array of 2D NAND memory cells, each of which includes a floating-gate transistor. The array of 2D NAND memory cells include a plurality of 2D NAND memory strings, each of which includes a plurality of memory cells (e.g., 32 to 128 memory cells) connected in series (resembling a NAND gate) and two select transistors, according to some embodiments. Each 2D NAND memory string is arranged in the same plane on the substrate (in 2D), according to some embodiments. In some embodiments, the array of NAND memory cells are an array of 3D NAND memory strings, each of which extends vertically above the substrate (in 3D) through a memory stack. Depending on the 3D NAND technology (e.g., the number of layers/tiers in the memory stack), a 3D NAND memory string typically includes 32 to 256 NAND memory cells, each of which includes a floating-gate transistor or a charge-trap transistor.

As shown in FIG. 1, semiconductor device 100 further includes interposer structure 106, between and conductively connecting semiconductor structures 102 and 104. Interposer structure 106 may include an adhesive material at interfaces 108-1 and 108-2 with the respective semiconductor structures (e.g., 102 and 104). The adhesive material may include any suitable insulating material that has desired bonding strength to semiconductor structures 102 and 104 (or to the dielectric materials of semiconductor structures 102 and 104 disposed at interfaces 108-1 and 108-2). In some embodiments, interposer structure 106 includes an adhesive polymer at interfaces. In some embodiments, interposer structure 106 also includes an adhesive polymer between interfaces 108-1 and 108-2. In some embodiments, an adhesive polymer a synthetic bonding substance made from polymers. An adhesive polymer can be in any suitable forms, such as urethanes, epoxies, resins, cyanoacrylates, and methacrylates. In some embodiments, the adhesive polymer includes epoxy.

To conductively connect semiconductor structures 102 and 104, interposer structure 106 may include a plurality of interposer contacts disposed on interfaces 108-1 and 108-2. Specifically, interposer contacts may be disposed in a respective bonding layer at opposite surfaces/sides (e.g., top and bottom surfaces/sides) and in contact with semiconductor structures 102 and 104. The interposer contacts may be conductively connected to the bonding contacts in semiconductor structures 102 and 104. In some embodiments, the interposer contacts are in contact with the bonding contacts. To conductively connect the interposer contacts on opposite sides/surfaces, interposer structure 106 may also include a redistribution layer between the interposer contacts. The redistribution layer may include the same material(s) as the bonding layers or include different materials. In some embodiments, the bonding layers and the redistribution layer include the same material, e.g., epoxy or any other adhesive polymer.

In some embodiments, the redistribution layer includes one or more levels of conductive routings that are conductively connected to the interposer contacts at interfaces 108-1 and 108-2. The conductive routings may be embedded in the redistribution layer and distributed laterally (e.g., along the x-z plane) and vertically (e.g., along the y-axis) in one or more levels. The number of levels and layout of the conductive routings may be flexibly designed based on factors such as the space, the positions of the interposer contacts, the positions of the bonding contacts in the semiconductor structures, the routing methods, and so on. The flexible/customized design of the conductive routings may allow the interposer contacts to be formed at desired locations, facilitating easy alignment and attachment/bonding between interposer structure 106 and semiconductor structures 102 and 104. The conductive routings and the interposer contacts may include any suitable conductive materials such as one or more of tungsten, cobalt, aluminum, copper, polysilicon, and silicides.

It is understood that the relative positions and the number of stacked semiconductor structures are not limited. In some embodiments, the array of NAND memory cells are above the logic process-compatible devices, along the y-axis. Data transfer between the NAND memory and the logic process-compatible devices (e.g., processors and RAM) can be performed through the bonding contacts and across interposer structure 106.

Figure 2A:
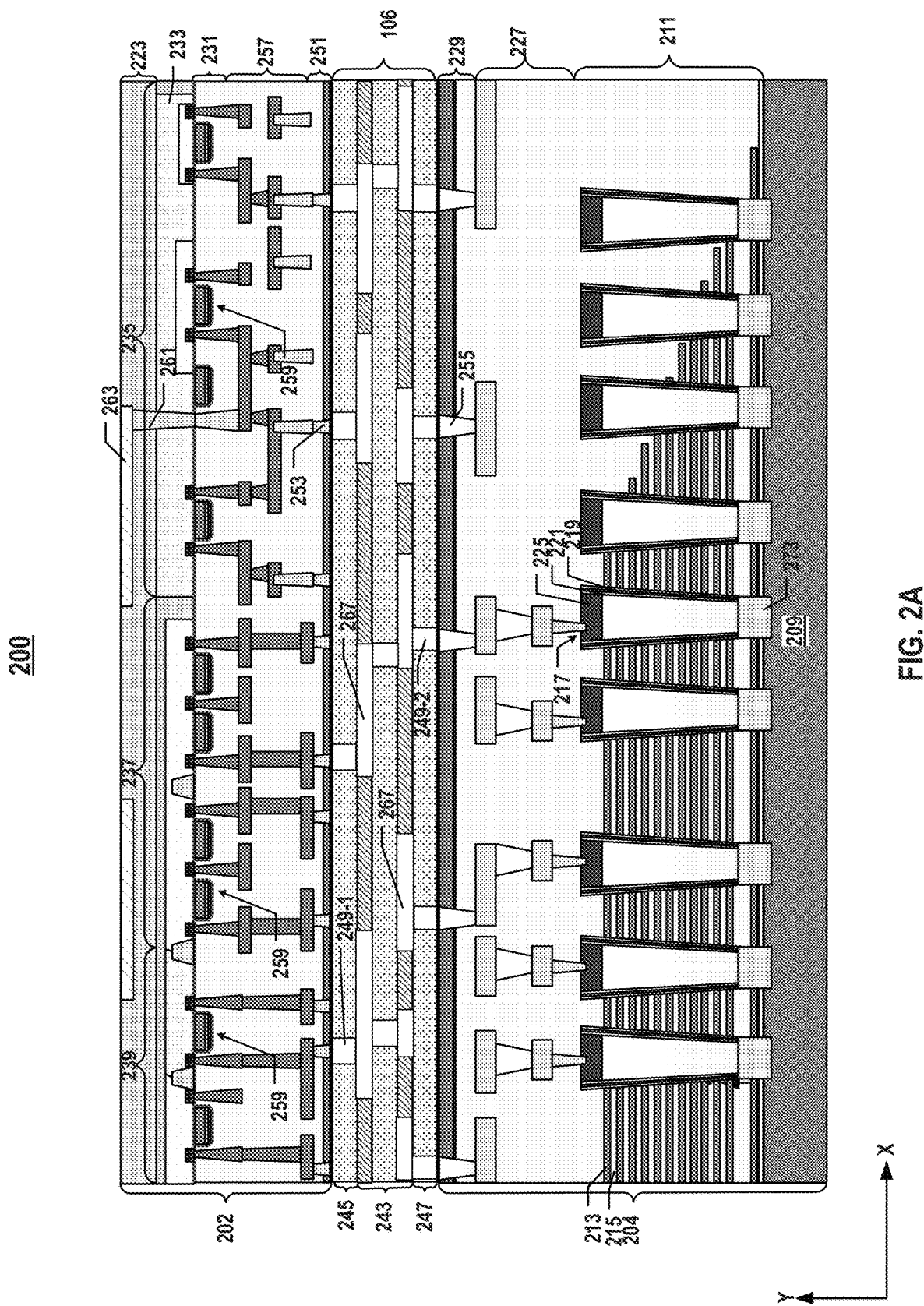
FIG. 2A illustrates a detailed schematic view of a cross-section of an exemplary semiconductor device, according to some embodiments.
Figure 2B:
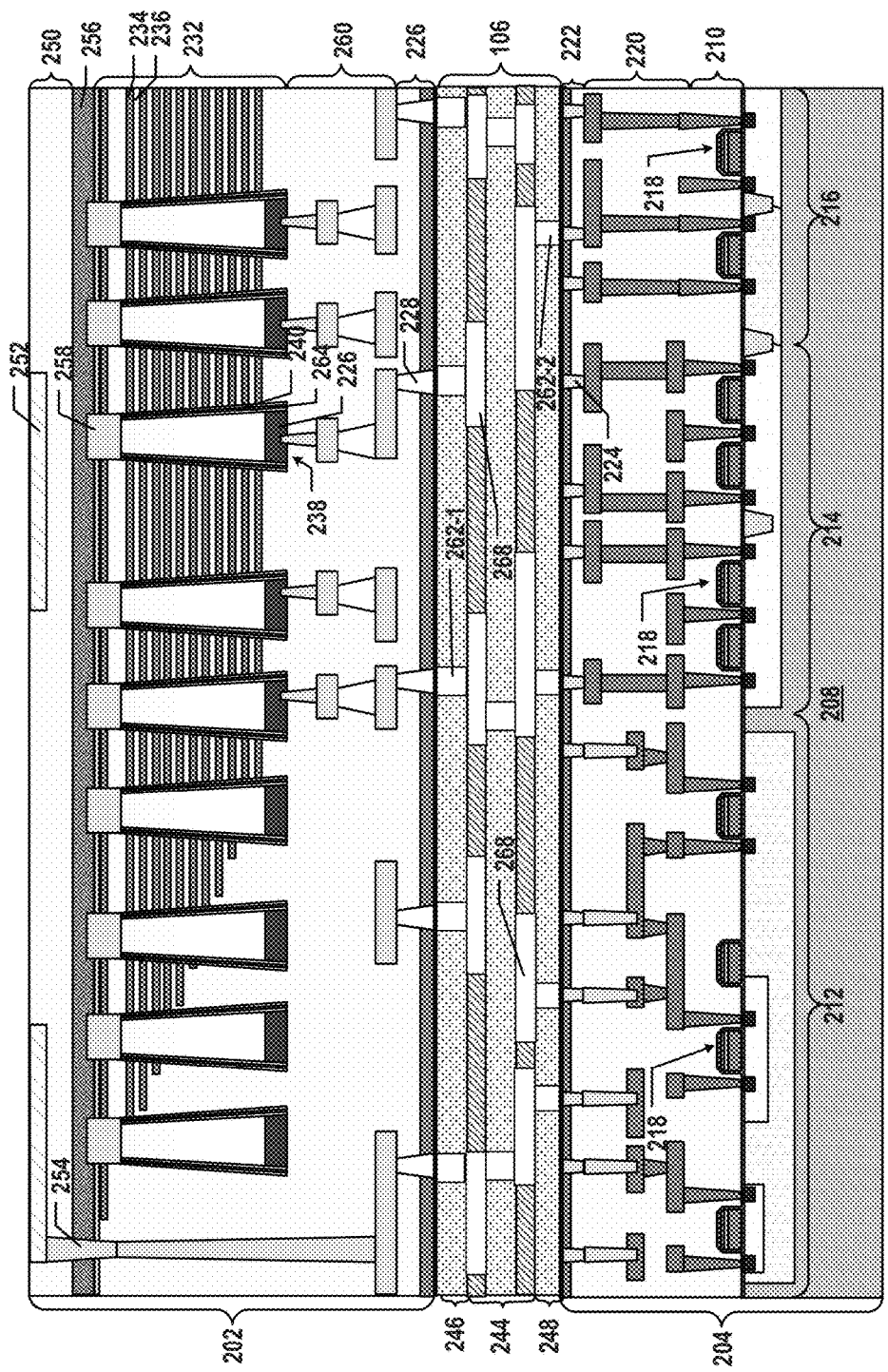
FIG. 2B illustrates a detailed schematic view of a cross-section of another exemplary semiconductor device, according to some embodiments.

FIGS. 2A and 2B illustrate different semiconductor devices 200 and 201. Specifically, in semiconductor device 200, the logic process-compatible devices are positioned above the array of NAND memory cells along the y-axis; in semiconductor device 201, the array of NAND memory cells is positioned above the logic process-compatible devices along the y-axis. It should be noted that the embodiments of the present disclosure are described in view of two semiconductor structures, for the ease of illustration. In many other embodiments, more than two semiconductor structures may be stacked vertically using more than one interposer structures. The redistribution layer (e.g., conductive routings in the redistribution layer) in each interposer structure may be the same or similar, depending on the design and/or the bonding contacts on the semiconductor structures. The number of semiconductor structures and the layout/arrangement of the conductive routings in respective interposer structures should not be limited by the embodiments of the present disclosure.

FIG. 2A illustrates a cross-section of an exemplary semiconductor device 200, according to some embodiments. As one example of semiconductor device 100 described above with respect to FIG. 1, semiconductor device 200 is a bonded chip including a second semiconductor structure 204 and a first semiconductor structure 202 stacked over second semiconductor structure 204. First and second semiconductor structures 202 and 204 are joined by an interposer structure 106 therebetween, according to some embodiments. As shown in FIG. 2A, second semiconductor structure 204 can include a substrate 209, which can include silicon (e.g., single crystalline silicon, c-Si), silicon germanium (SiGe), gallium arsenide (GaAs), germanium (Ge), silicon on insulator (SOI), or any other suitable materials.

Second semiconductor structure 204 of semiconductor device 200 can include a memory stack 211 above substrate 209. It is noted that x- and y-axes are added in FIG. 2A to further illustrate the spatial relationship of the components in semiconductor device 200. Substrate 209 includes two lateral surfaces (e.g., a top surface and a bottom surface) extending laterally in the x-axis (the lateral direction or width direction). As used herein, whether one component (e.g., a layer or a device) is "on," "above," or "below" another component (e.g., a layer or a device) of a semiconductor device (e.g., semiconductor device 200) is determined relative to the substrate of the semiconductor device (e.g., substrate 209) in the y-axis (the vertical direction or thickness direction) when the substrate is positioned in the lowest plane of the semiconductor device in the y-axis. The same notion for describing the spatial relationship is applied throughout the present disclosure.

In some embodiments, second semiconductor structure 204 of semiconductor device 200 includes a NAND flash memory device in which memory cells are provided in the form of an array of 3D NAND memory strings 217. Each 3D NAND memory string 217 extends vertically through a plurality of pairs each including a conductor layer 213 and a dielectric layer 215, according to some embodiments. The stacked and interleaved conductor layers 213 and dielectric layer 215 are also referred to herein as a memory stack 211. Interleaved conductor layers 213 and dielectric layers 215 in memory stack 211 alternate in the vertical direction, according to some embodiments. In other words, except for the ones at the top or bottom of memory stack 211, each conductor layer 213 can be adjoined by two dielectric layers 215 on both sides, and each dielectric layer 215 can be adjoined by two conductor layers 213 on both sides. Conductor layers 213 can each have the same thickness or different thicknesses. Similarly, dielectric layers 215 can each have the same thickness or different thicknesses. Conductor layers 213 can include conductor materials including, but not limited to, W, Co, Cu, Al, doped silicon, silicides, or any combination thereof. Dielectric layers 215 can include dielectric materials including, but not limited to, silicon oxide, silicon nitride, silicon oxynitride, or any combination thereof.

In some embodiments, each 3D NAND memory string 217 is a "charge trap" type of NAND memory string including a semiconductor channel 221 and a memory film 219. In some embodiments, semiconductor channel 221 includes silicon, such as amorphous silicon, polysilicon, or single crystalline silicon. In some embodiments, memory film 219 is a composite dielectric layer including a tunneling layer, a storage layer (also known as "charge trap/storage layer"), and a blocking layer. Each 3D NAND memory string 217 can have a cylinder shape (e.g., a pillar shape). Semiconductor channel 221, the tunneling layer, the storage layer, and the blocking layer of memory film 219 are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as aluminum oxide ($Al_2O_3$), hafnium oxide ($HfO_2$) or tantalum oxide ($Ta_2O_5$) layer, and so on.

In some embodiments, 3D NAND memory strings 217 further include a plurality of control gates (each being part of a word line). Each conductor layer 213 in memory stack 211 can act as a control gate for each memory cell of 3D NAND memory string 217. In some embodiments, each 3D NAND memory string 217 includes two plugs 273 and 225 at a respective end in the vertical direction. Plug 273 can include a semiconductor material, such as single-crystal silicon, that is epitaxially grown from substrate 209. Plug 273 can function as the channel controlled by a source select gate of 3D NAND memory string 217. Plug 273 can be at the lower end of 3D NAND memory string 217 and in contact with semiconductor channel 221. As used herein, the "upper end" of a component (e.g., 3D NAND memory string 217) is the end farther away from substrate 209 in the y-axis, and the "lower end" of the component (e.g., 3D NAND memory string 217) is the end closer to substrate 209 in the y-axis when substrate 209 is positioned in the lowest plane of semiconductor device 200. Another Plug 225 can include semiconductor materials (e.g., polysilicon). By covering the upper end of 3D NAND memory string 217 during the fabrication of second semiconductor structure 204, plug 225 can function as an etch stop layer to prevent etching of dielectrics filled in 3D NAND memory string 217, such as silicon oxide and silicon nitride. In some embodiments, plug 225 functions as the drain of 3D NAND memory string 217.

It is understood that 3D NAND memory strings 217 are not limited to the "charge trap" type of 3D NAND memory strings and may be "floating gate" type of 3D NAND memory strings in other embodiments. Substrate 209 may include polysilicon as the source plate of the "floating gate" type of 3D NAND memory strings.

In some embodiments, second semiconductor structure 204 of semiconductor device 200 further includes an interconnect layer 227 above memory stack 211 to transfer electrical signals. Interconnect layer 227 can include a plurality of interconnects, such as MEOL interconnects and BEOL interconnects. In some embodiments, the interconnects in interconnect layer 227 also include local interconnects, such as bit line contacts and word line contacts. Interconnect layer 227 can further include one or more ILD layers in which the interconnect lines and via contacts can form. The interconnect lines and via contacts in interconnect layer 227 can include conductive materials including, but not limited to W, Co, Cu, Al, silicides, or any combination thereof. ILD layers in interconnect layer 227 can include dielectric materials including, but not limited to, silicon oxide, silicon nitride, silicon oxynitride, low-k dielectrics, or any combination thereof.

In some embodiments, first semiconductor structure 202 includes a device layer 231 which includes a processor 235 and an array of RAM cells 237 outside of processor 235. In some embodiments, device layer 231 further includes a peripheral circuit 239 outside of processor 235. For example, peripheral circuit 239 may be part or the entirety of the peripheral circuits for controlling and sensing the NAND memory of semiconductor device 200 as described below in detail. In some embodiments, processor 235 includes a plurality of transistors 259 forming any suitable specialized processors and/or SoCs as described above in detail. In some embodiments, transistors 259 also form array of RAM cells 237 used as, for example, cache and/or data buffer of semiconductor device 200. For example, array of RAM cells 237 may function as the internal instruction cache and/or data cache of processor 235. Array of RAM cells 237 can be distributed in a plurality of separate regions in first semiconductor structure 202. In some embodiments, transistors 259 further form peripheral circuit 239, i.e., any suitable digital, analog, and/or mixed-signal control and sensing circuits used for facilitating the operation of the NAND memory including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors).

In some embodiments, first semiconductor structure 202 includes an interconnect layer 257 under and in contact with device layer 231 to transfer electrical signals to and from processor 235 and array of RAM cells 237 (and peripheral circuit 239 if any). Interconnect layer 257 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Interconnect layer 257 can further include one or more interlayer dielectric (ILD) layers (also known as "intermetal dielectric (IMD) layers") in which the interconnect lines and via contacts can form. That is, interconnect layer 257 can include interconnect lines and via contacts in multiple ILD layers. The interconnect lines and via contacts in interconnect layer 257 can include conductive materials including, but not limited to, tungsten (W), cobalt (Co), copper (Cu), aluminum (Al), silicides, or any combination thereof. The ILD layers in interconnect layer 257 can include dielectric materials including, but not limited to, silicon oxide, silicon nitride, silicon oxynitride, low dielectric constant (low-k) dielectrics, or any combination thereof. In some embodiments, the devices in device layer 231 are electrically connected to one another through the interconnects in interconnect layer 257. For example, array of RAM cells 237 may be electrically connected to processor 235 through interconnect layer 257.

In some embodiments, first semiconductor structure 202 includes a semiconductor layer 233 above and in contact with device layer 231. Semiconductor layer 233 can be a thinned substrate on which device layer 231 (e.g., transistors 259) is formed. In some embodiments, semiconductor layer 233 includes single-crystal silicon. In some embodiments, semiconductor layer 233 can include polysilicon, amorphous silicon, SiGe, GaAs, Ge, or any other suitable materials. Semiconductor layer 233 can also include isolation regions and doped regions.

Transistors 259 can be formed "on" semiconductor layer 233, in which the entirety or part of transistors 259 are formed in semiconductor layer 233 (e.g., above the bottom surface of semiconductor layer 233) and/or directly on semiconductor layer 233. Isolation regions (e.g., shallow trench isolations (STIs)) and doped regions (e.g., source regions and drain regions of transistors 259) can be formed in semiconductor layer 233 as well. Transistors 259 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments.

First semiconductor structure 202 of semiconductor device 200 can further include a pad-out interconnect layer 223 above semiconductor layer 233. Pad-out interconnect layer 223 can include interconnects, e.g., contact pads 263, in one or more ILD layers. In some embodiments, the interconnects in pad-out interconnect layer 223 can transfer electrical signals between semiconductor device 200 and outside circuits, e.g., for pad-out purposes. Pad-out interconnect layer 223 and interconnect layer 257 can be formed at opposite sides of semiconductor layer 233.

In some embodiments, first semiconductor structure 202 further includes one or more contacts 261 extending through semiconductor layer 233 to electrically connect pad-out interconnect layer 223 and interconnect layers 227 and 257. As a result, processor 235 and/or array of RAM cells 237 (and peripheral circuit 239 if any) can be electrically connected to array of 3D NAND memory strings 217 through interconnect layers 227 and 257 as well as bonding contacts 253 and 255. Moreover, processor 235, array of RAM cells 237, and array of 3D NAND memory strings 217 can be electrically connected to outside circuits through contacts 261 and pad-out interconnect layer 223.

As shown in FIG. 2A, second semiconductor structure 204 of semiconductor device 200 can further include a bonding layer 229 at the upper surface and above interconnect layer 227 and memory stack 211. Bonding layer 229 can include a plurality of bonding contacts 255 and dielectrics electrically isolating bonding contacts 255. Bonding contacts 255 can include conductive materials including, but not limited to, W, Co, Cu, Al, silicides, or any combination thereof. The remaining area of bonding layer 229 can be formed with dielectrics including, but not limited to, silicon oxide, silicon nitride, silicon oxynitride, low-k dielectrics, or any combination thereof. Bonding contacts 255 can be exposed at the upper surface of second semiconductor structure 204.

Similarly, as shown in FIG. 2A, first semiconductor structure 202 of semiconductor device 200 can also include a bonding layer 251 at the lower surface of and above bonding layer 229 of second semiconductor structure 204. Bonding layer 251 can include a plurality of bonding contacts 253 and dielectrics electrically isolating bonding contacts 253. Bonding contacts 253 can include conductive materials including, but not limited to, W, Co, Cu, Al, silicides, or any combination thereof. The remaining area of bonding layer 251 can be formed with dielectrics including, but not limited to, silicon oxide, silicon nitride, silicon oxynitride, low-k dielectrics, or any combination thereof. Bonding contacts 253 and bonding contacts 255 at each in contact with interposer structure 106, according to some embodiments.

Interposer structure 106 may include a first interposer bonding layer 245 and a second interposer bonding layer 247. In some embodiments, interposer structure 106 further includes a redistribution layer 243 between first and second interposer bonding layers 245 and 247. First and second interposer bonding layers 245 and 247 may each include an adhesive and insulating material such as adhesive polymer. The material of first and second interposer bonding layers 245 and 247 may also have sufficient elasticity to adjust its shape to any deformation (e.g., wafer bow) of first and second semiconductor structure 102 and 104, allowing the adhesion and electrical connection to be maintained. First and second interposer bonding layers 245 and 247 may thus be attached/bonded to first and second semiconductor structure 102 and 104 respectively at the upper and the lower surfaces of interposer structure 106. In some embodiments, first and second interposer bonding layers 245 and 247 are bonded to the dielectric materials of bonding layers 251 and 229. First and second semiconductor structures 102 and 104 may be bonded together through interposer structure 106.

First interposer bonding layer 245 may include a plurality of first interposer contacts 249-1 distributed in first interposer bonding layer 245. Second interposer bonding layer 247 may include a plurality of second interposer contacts 249-2 distributed in second interposer bonding layer 247. In some embodiments, first interposer contacts 249-1 are in contact with and conductively connected to bonding contacts 253 and second interposer contacts 249-2 are in contact with and conductively connected to bonding contacts 255. First and second interposer bonding layers 245 and 247 may thus be in contact with and conductively connected to, respectively, first and second semiconductor structures 102 and 104. Specifically, the electrical connection between interposer structure 106 and first semiconductor structure 202 may be formed through first interposer contacts 249-1, bonding contacts 253 (or bonding layer 251), and interconnect layer 257. Similarly, the electrical connection between interposer structure 106 and second semiconductor structure 204 may be formed through second interposer contacts 249-2, bonding contacts 255 (or bonding layer 229), and interconnect layer 227.

Interposer structure 106 may also include a redistribution layer 243, in contact with and conductively connected to first and second interposer contacts 249 in first and second interposer bonding layers 245 and 247. Redistribution layer 243 may include a plurality of conductive routings 267 distributed in one or more levels along the y-axis. As an example, as shown in FIG. 2A, conductive routings 267 distributed in two levels are depicted. Redistribution layer 243 may include the same or different material, as first and second interposer bonding layers 245 and 247, in which conductive routings 267 are embedded. In some embodiments, redistribution layer 243, and first and second interposer bonding layers 245 and 247 include the same material(s). Conductive routings 267 in different levels (if more than one level is formed), can be conductively connected so that first interposer contacts 249-1 are conductively connected to second interposer contacts 249-2. In some embodiments, conductive routings 267 include, but not limited to, tungsten, cobalt, copper, aluminum, silicides, and polysilicon. In some embodiments, conductive routings 267 and interposer contacts 249 include the same material(s). First semiconductor structure 202 may be conductively connected to second semiconductor structure 204 through interconnect layers 257 and 227, bonding layers 251 and 229, interposer contacts 249 (e.g., interposer bonding layers 245 and 247), and redistribution layer 243. In various embodiments, interposer contacts 249 and conductive routings 267 may be flexibly designed or customized to optimize the contact with respective semiconductor structures.

As described above, first semiconductor structure 202 can be bonded on top of second semiconductor structure 204 in a face-to-face manner through interposer structure 106. As shown in FIG. 2A, in some embodiments, logic process-compatible devices are above the array of 3D NAND memory cells, e.g., device layer 231 is above memory stack 211, which is above substrate 209. However, in some embodiments, the array of 3D NAND memory cells is above the logic process-compatible devices. FIG. 2B illustrates a cross-section of another exemplary semiconductor device 201, in which an array of 3D NAND memory cells is above logic process-compatible devices, which is above a respective substrate, according to some embodiments. As shown in FIG. 2B, semiconductor device 201 is a bonded chip/device including a second semiconductor structure 204 and a first semiconductor structure 202 stacked over second semiconductor structure 204. Semiconductor device 201 represents an example of a bonded chip in which first semiconductor structure 202 including NAND memory and second semiconductor structure 204 including logic process-compatible devices such as a processor, RAM cells, and peripheral circuits, formed separately and bonded in a face-to-face manner by interposer structure 106. It is understood that the details of similar structures (e.g., materials, fabrication process, functions, etc.) in both semiconductor devices 200 and 201 may not be repeated below.

Second semiconductor structure 204 of semiconductor device 201 can include a substrate 208 and a device layer 210 above and/or partially in substrate 208. In some embodiments, device layer 210 includes a processor 212 and an array of RAM cells 214 of processor 212. In some embodiments, device layer 210 further includes a peripheral circuit 216 outside of processor 212. For example, peripheral circuit 216 may be part or the entirety of the peripheral circuits for controlling and sensing array of a 3D NAND memory strings in first semiconductor structure 202.

In some embodiments, processor 212 includes a plurality of transistors 218 forming any suitable specialized processors and/or SoCs. Transistors 218 can be formed on substrate 208, in which the entirety or part of transistors 218 are formed in substrate 208 and/or directly on substrate 208. Isolation regions (e.g., STIs) and doped regions (e.g., source regions and drain regions of transistors 218) can be formed in substrate 208 as well. Transistors 218 can form array of RAM cells 214 (and peripheral circuit 216 if any). Transistors 218 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments.

In some embodiments, second semiconductor structure 204 of semiconductor device 201 also includes an interconnect layer 220 above device layer 210 to transfer electrical signals. Interconnect layer 220 can include a plurality of interconnects, including interconnect lines and via contacts.

In some embodiments, the devices in device layer 210 are electrically connected to one another through the interconnects in interconnect layer 220.

In some embodiments, second semiconductor structure 204 of semiconductor device 201 further includes a bonding layer 222 at the upper surface and above device layer 210. Bonding layer 222 can include a plurality of bonding contacts 224 and dielectrics surrounding and electrically isolating bonding contacts 224. Bonding layer 222 may be attached to interposer structure 106.

In some embodiments, first semiconductor structure 202 includes a semiconductor layer 256 on which a memory stack 232 including interleaved conductor layers 234 and dielectric layers 236 is located. Semiconductor layer 256 may be above memory stack 232, which is above an interconnect layer 260. In some embodiments, an array of 3D NAND memory strings 238 each extends vertically through interleaved conductor layers 234 and dielectric layers 236 in memory stack 232. Each 3D NAND memory string 238 can include a semiconductor channel 264 and a memory film 240. Each 3D NAND memory string 238 further includes two plugs 258 and 238 at its lower end and upper end, respectively. 3D NAND memory strings 238 can be "charge trap" type of 3D NAND memory strings or "floating gate" type of 3D NAND memory strings. In some embodiments, a pad oxide layer including silicon oxide is disposed between memory stack 232 and semiconductor layer 256. Semiconductor layer 256 can be above and in contact with memory stack 232. Semiconductor layer 256 can be a thinned substrate on which memory stack 232 and 3D NAND memory strings 238 are formed. In some embodiments, semiconductor layer 256 includes single-crystal silicon. In some embodiments, semiconductor layer 256 can include polysilicon, amorphous silicon, SiGe, GaAs, Ge, or any other suitable materials. Semiconductor layer 256 can also include isolation regions and doped regions In some embodiments, second semiconductor structure 204 of semiconductor device 201 also includes an interconnect layer 260 below memory stack 232 and 3D NAND memory strings 238 to transfer electrical signals to and from 3D NAND memory strings 238. Interconnect layer 260 can include a plurality of interconnects, including interconnect lines and via contacts. In some embodiments, the interconnects in interconnect layer 260 also include local interconnects, such as bit line contacts and word line contacts.

As shown in FIG. 2B, first semiconductor structure 202 of semiconductor device 201 includes another bonding layer 226 at the lower surface, and below interconnect layer 260 and above bonding layer 222. Bonding layer 226 can include a plurality of bonding contacts 228 and dielectrics surrounding and electrically isolating bonding contacts 228.

As shown in FIG. 2B, first semiconductor structure 202 of semiconductor device 201 can further include a pad-out interconnect layer 250 above semiconductor layer 256. Pad-out interconnect layer 250 can include interconnects, e.g., contact pads 252, in one or more ILD layers. In some embodiments, the interconnects in pad-out interconnect layer 250 can transfer electrical signals between semiconductor device 201 and outside circuits, e.g., for pad-out purposes. In some embodiments, first semiconductor structure 202 further includes one or more contacts 254 extending through semiconductor layer 256 to electrically connect pad-out interconnect layer 250 and interconnect layers 220 and 260. As a result, processor 212 and array of RAM cells 214 (and peripheral circuit 216 if any) can also be electrically connected to array of 3D NAND memory strings 238 through interconnect layers 220 and 260 as well as bonding contacts 228 and 224. Moreover, processor 212, array of RAM cells 214, and array of 3D NAND memory strings 238 can be electrically connected to outside circuits through contacts 254 and pad-out interconnect layer 250.

As shown in FIG. 2B, first semiconductor structure 202 may be bonded to second semiconductor structure 204 through interposer structure 106. Specifically, interposer structure 106 may be bonded to first semiconductor structure 202 through first interposer bonding layer 246 and bonded to second semiconductor structure 204 through second interposer bonding 248. First interposer contacts 262-1 may be in contact with and conductively connected to bonding contacts 228. Second interposer contacts 262-2 may be in contact with and conductively connected to bonding contacts 224. Redistribution layer 244, between first and second interposer bonding layers 246 and 248, may include a plurality of conductive routings 268, and may be in contact with and conductively connected to first and second interposer bonding layers 246 and 248 through conductive routings 268.

Figure 3A:
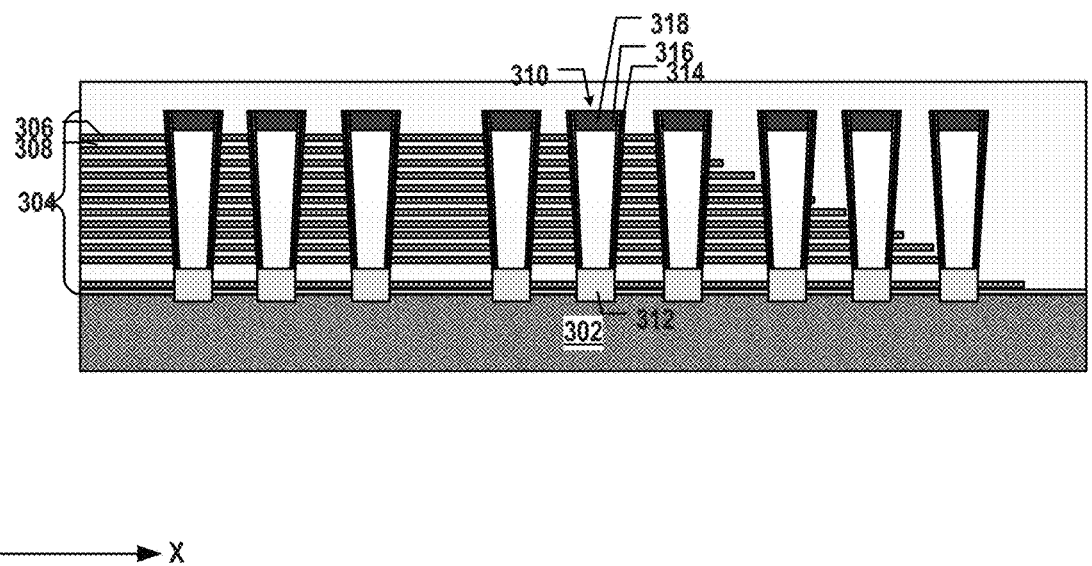
FIGS. 3A and 3B illustrate a fabrication process for forming a semiconductor structure in the semiconductor device in FIGS. 1, 2A, and 2B, according to some embodiments.
Figure 3B:
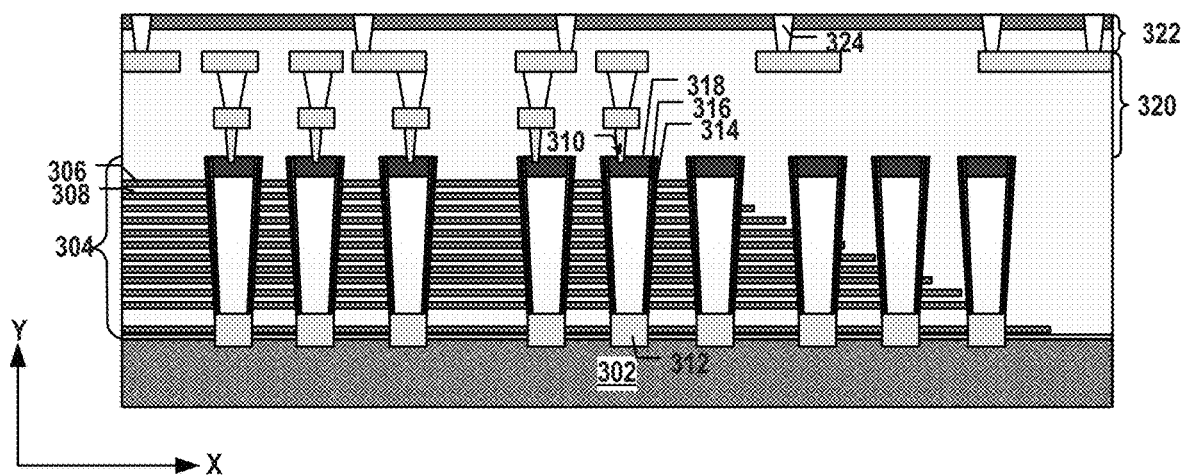

FIGS. 3A and 3B illustrate one example of the formation of a semiconductor structure 300 with an array of 3D NAND memory cells, according to some embodiments. Semiconductor structure 300 may be similar to or the same as second semiconductor structure 204 in FIG. 2A and first semiconductor structure 102 in FIG. 2B. In some embodiments, semiconductor structure 300 is formed before the bonding process.

In some embodiments, a memory stack is formed above a substrate, and an array of NAND memory strings extending vertically through the memory stack are formed. As illustrated in FIG. 3A, interleaved sacrificial layers (not shown) and dielectric layers 308 are formed above a silicon substrate 302. The interleaved sacrificial layers and dielectric layers 308 can form a dielectric stack (not shown). In some embodiments, each sacrificial layer includes a layer of silicon nitride, and each dielectric layer 308 includes a layer of silicon oxide. The interleaved sacrificial layers and dielectric layers 308 can be formed by one or more thin film deposition processes including, but not limited to, chemical vapor deposition (CVD), physical vapor deposition (PVD), atomic layered deposition (ALD), or any combination thereof. In some embodiments, a memory stack 304 can be formed by a gate replacement process, e.g., replacing the sacrificial layers with conductor layers 306 using wet/dry etch of the sacrificial layers selective to dielectric layers 308 and filling the resulting recesses with conductor layers 306. As a result, memory stack 304 can include interleaved conductor layers 306 and dielectric layers 308. In some embodiments, each conductor layer 306 includes a metal layer, such as a layer of tungsten. It is understood that memory stack 304 may be formed by alternatingly depositing conductor layers (e.g., doped polysilicon layers) and dielectric layers (e.g., silicon oxide layers) without the gate replacement process in other embodiments. In some embodiments, a pad oxide layer including silicon oxide is formed between memory stack 304 and silicon substrate 302.

As illustrated in FIG. 3A, 3D NAND memory strings 310 are formed above silicon substrate 302, each of which extends vertically through interleaved conductor layers 306 and dielectric layers 308 of memory stack 304. In some embodiments, fabrication processes to form 3D NAND memory string 310 include forming a channel hole through memory stack 304 and into silicon substrate 302 using dry etching/and or wet etching, such as deep reactive-ion etching (DRIE), followed by epitaxially growing a plug 312 in the lower portion of the channel hole from silicon substrate 302. In some embodiments, fabrication processes to form 3D NAND memory string 310 also include subsequently filling the channel hole with a plurality of layers, such as a memory film 314 (e.g., a tunneling layer, a storage layer, and a blocking layer) and a semiconductor layer 316, using thin film deposition processes such as ALD, CVD, PVD, or any combination thereof. In some embodiments, fabrication processes to form 3D NAND memory string 310 further include forming another plug 318 in the upper portion of the channel hole by etching a recess at the upper end of 3D NAND memory string 310, followed by filling the recess with a semiconductor material using thin film deposition processes such as ALD, CVD, PVD, or any combination thereof. In some embodiments, instead of an array of 3D NAND memory cells, an array of 2D NAND memory cells are formed on silicon substrate 302. In some embodiments, the 2D NAND memory cells include "floating gate" type of 2D NAND memory cells and/or "charge trap" type of 2D NAND memory cells.

In some embodiments, an interconnect layer is formed above the array of NAND memory cells. The interconnect layer can include a plurality of interconnects in one or more ILD layers. As illustrated in FIG. 3B, an interconnect layer 320 can be formed above memory stack 304 and array of 3D NAND memory strings 310. Interconnect layer 320 can include interconnects of MEOL and/or BEOL in a plurality of ILD layers to make electrical connections with array of 3D NAND memory strings 310. In some embodiments, interconnect layer 320 includes multiple ILD layers and interconnects therein formed in multiple processes. For example, the interconnects in interconnect layers 320 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 3B can be collectively referred to as interconnect layer 320. In some embodiments, the interconnect layer is formed above the array of 2D NAND memory cells.

In some embodiments, a bonding layer is formed above the interconnect layer. The second bonding layer can include a plurality of bonding contacts. As illustrated in FIG. 3B, a bonding layer 322 is formed above interconnect layer 320. Bonding layer 322 can include a plurality of bonding contacts 324 surrounded by dielectrics. In some embodiments, a dielectric layer is deposited on the top surface of interconnect layer 320 by one or more thin film deposition processes including, but not limited to, CVD, PVD, ALD, or any combination thereof. Bonding contacts 324 then can be formed through the dielectric layer and in contact with the interconnects in interconnect layer 320 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing an adhesion (glue) layer, a barrier layer, and/or a seed layer before depositing the conductor. In some embodiments, bonding contacts 324 are disposed at and exposed by the upper surface of bonding layer 322. Semiconductor structure 300 may thus be formed.

Figure 4A:
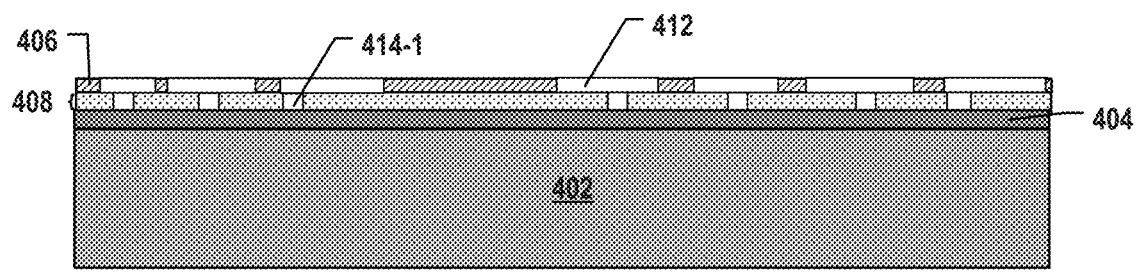
FIGS. 4A and 4B illustrate a fabrication process for forming an interposer structure in the semiconductor device in FIGS. 1, 2A, and 2B, according to some embodiments.
Figure 4B:
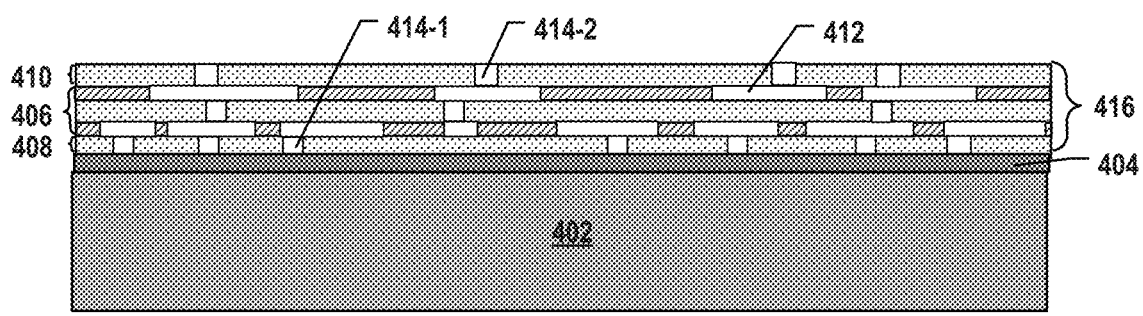
Figure 8:
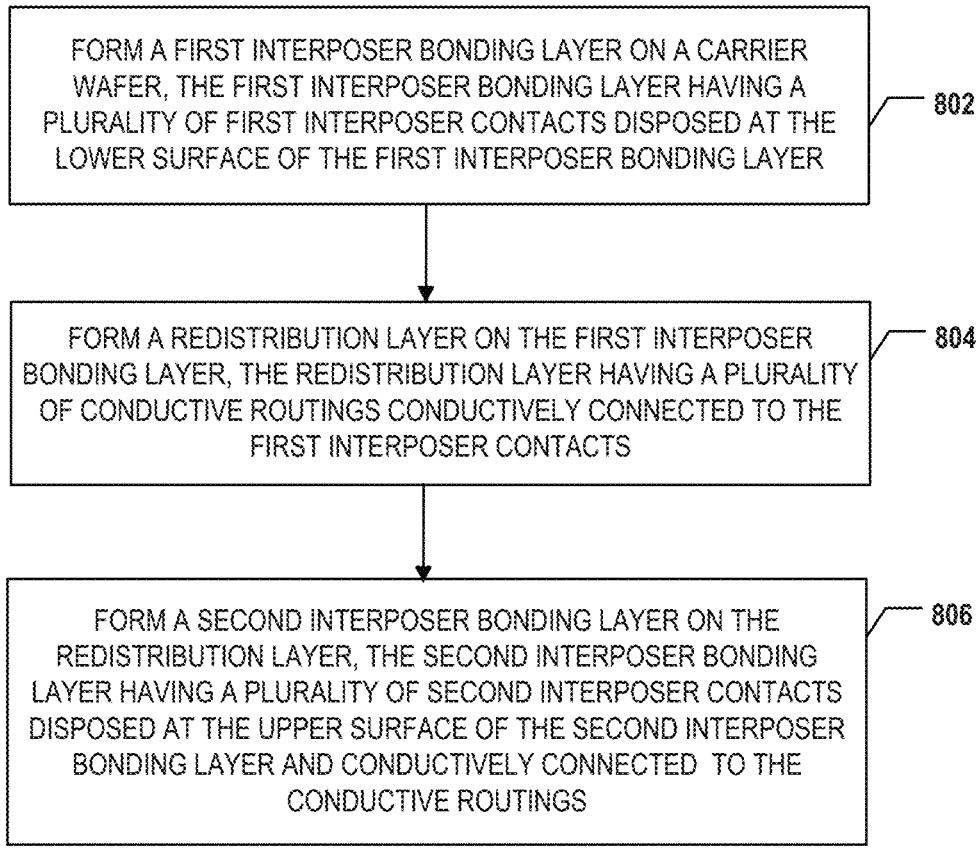
FIG. 8 illustrates a flowchart of an exemplary fabrication process for forming an interposer structure, according to some embodiments.

FIGS. 4A and 4B illustrate an exemplary fabrication process to form an interposer structure 416, according to some embodiments. FIG. 8 illustrates a flowchart of a method 800 for forming an interposer structure, according to some embodiments. It is understood that the operations shown in method 800 are not exhaustive and that other operations can be performed as well before, after, or between any of the illustrated operations. Further, some of the operations may be performed simultaneously, or in a different order than shown in FIG. 8.

Referring to FIG. 8, method 800 starts at operation 802, in which a first interposer bonding layer is formed on a carrier wafer, the first interposer bonding having a plurality of first interposer contacts disposed at the lower surface of the first interposer bonding layer. FIG. 4A illustrates a corresponding structure.

As shown in FIG. 4A, a first interposer bonding layer 408 can be formed on a carrier wafer 402. Carrier wafer 402 may include any suitable material that has sufficient strength to support the fabrication of interposer structure and the subsequent bonding process. For example, carrier wafer 402 may include a silicon wafer, a piece of glass, a piece of sapphire, a piece of plastic, etc. First interposer bonding layer 408 may include a plurality of first interposer contacts 414-1 disposed at the lower surface of first interposer bonding layer 408. In some embodiments, first interposer contacts 414-1 are exposed at the lower surface of first interposer bonding layer 408. The layout/arrangement of first interposer contacts 414-1 may correspond to the layout/arrangement of bonding contacts in the first semiconductor structure. First interposer bonding layer 408 may be formed by depositing a layer of adhesive material over carrier wafer 402 and patterning the layer of adhesive material to form a plurality of contact holes that expose carrier wafer 402. A conductive material may be deposited to fill in the contact holes. The layer of adhesive material, e.g., adhesive polymer, may be deposited by any suitable methods such as spin coating, spray coating, etc. . . . The conductive material may be deposited by any suitable methods such as CVD, PVD, ALD, electroless plating, and/or electroplating. First interposer contacts 414-1 may be formed.

In some embodiments, a releasing layer 404 is formed between first interposer bonding layer 408 and carrier wafer 402. Releasing layer 404 may include a suitable material that can facilitate the debonding of the subsequently-formed interposer structure from carrier wafer 402. In some embodiments, releasing layer 404 includes a tape, and/or adhesive polymer. Depending on the material(s), releasing layer 404 may be formed on carrier wafer 402 by attaching a tape and/or depositing a layer of releasing material. The deposition method may include CVD, PVD, and/or ALD. In some embodiments, when releasing layer 404 is formed between first interposer bonding layer 408 and carrier wafer 402, first interposer contacts 414-1 may be disposed on the lower surface of releasing layer 404.

Referring back to FIG. 8, after the formation of first interposer bonding layer, method 800 proceeds to operation 804, in which a redistribution layer is formed on the first interposer bonding layer, the redistribution layer having a plurality of conductive routings conductively connected to the first interposer contacts. FIGS. 4A and 4B illustrate corresponding structures.

As shown in FIGS. 4A and 4B, a redistribution layer 406 can be formed on first interposer bonding layer 408. Redistribution layer 406 may be formed by forming one or more layers of insulating material(s) along the y-axis and form a plurality of conductive routings 412 in each layer. Conductive routings 412 may then be distributed in one or more levels along the y-axis. In some embodiments, each level of conductive routings 412 may be formed in a layer of insulating material(s), which can be same as or different from the material(s) of first interposer bonding layer 408. In some embodiments, the layer of insulating material(s) may be formed and patterned to form a plurality of routing openings, and a conductive material may be deposited to fill in the routing openings, forming a level of conductive routings 412. Different or same photomasks can be used to pattern each layer of insulating material(s), depending on the layout of conductive routings 412 in each level. The insulating material(s) may include a suitable dielectric material such as silicon oxide, silicon oxynitride, and/or silicon nitride, and formed by one or more of CVD, PVD, and ALD. The insulating material(s) may also include the adhesive polymer, same as or different from the material of first interposer bonding layer 408, and may be formed by one or more of spin-on coating, CVD, PVD, and ALD. The conductive material may be deposited by one or more of CVD, PVD, ALD, and/or electroplating. The conductive routings 412 in different levels may be conductively connected to one another.

Referring back to FIG. 8, after the formation of the redistribution layer, method 800 proceeds to operation 806, in which a second interposer bonding layer is formed on the redistribution layer, the second interposer bonding layer having a plurality of second interposer contacts disposed at the upper surface of the second interposer bonding layer and conductively connected to the conductive routings. FIG. 4B illustrates a corresponding structure.

As shown in FIG. 4B, a second interposer bonding layer 410 is formed on redistribution layer 406. Second interposer bonding layer 410 may include a plurality of second interposer contacts 414-2 disposed at and exposed by the upper surface of second interposer bonding layer 410. Second interposer contacts 414-2 may be conductively connected to conductive routings 412, which are further conductively connected to first interposer contacts 414-1. The layout/arrangement of first interposer contacts 414-2 may correspond to the layout/arrangement of bonding contacts in the second semiconductor structure. The formation and materials of second interposer bonding layer 410 may be the same as or similar to the formation and materials of first interposer bonding layer 408, and the detailed description is not repeated herein. An interposer structure 416 with first and second interposer bonding layers 408 and 410 and redistribution layer 406 in between, can be formed on a carrier wafer 402 (or releasing layer 404). It should be noted that, throughout the present disclosure, the structures of interposer structures and the electrical connections between the interposer structures and other structures/devices are for illustrative purposes only and are not meant to represent the actual structures or electrical connections of interposer structures. Unless specified, in each process/application, the structure (e.g., interposer contacts and/or conductive routings) of the interposer structure are designed and formed to match the respective bonding contacts to which the interposer structure is bonded/attached.

Figure 5A:
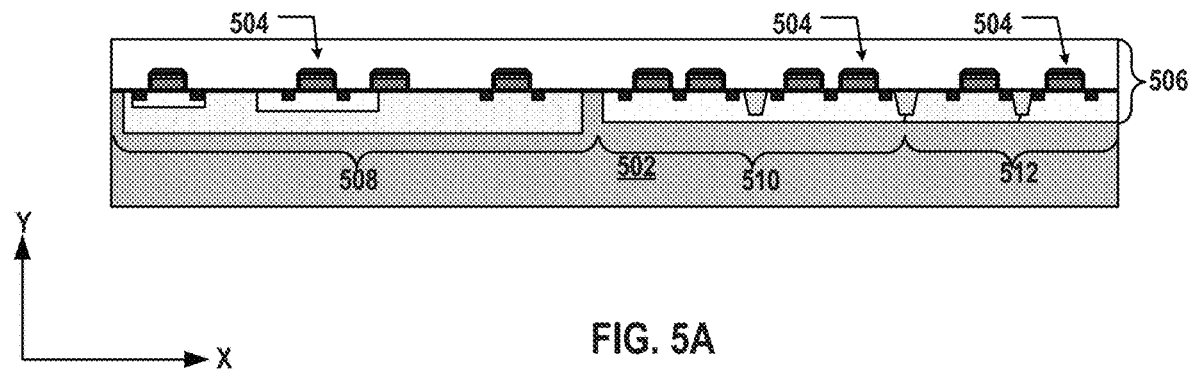
FIGS. 5A and 5B illustrate a fabrication process for forming another semiconductor structure in the semiconductor device of FIGS. 1, 2A, and 2B, according to some embodiments.
Figure 5B:
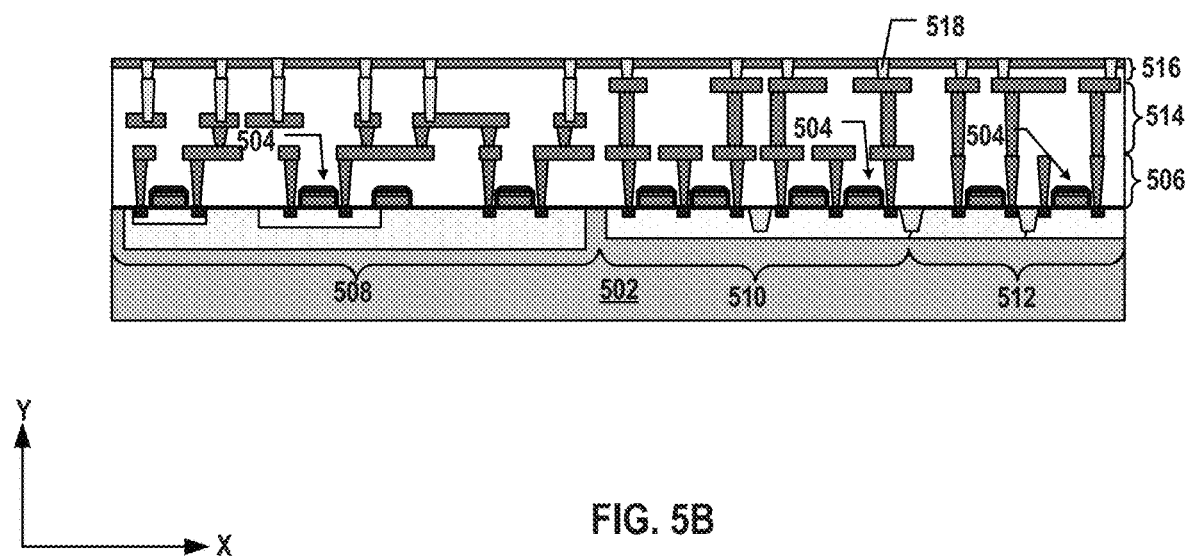

FIGS. 5A and 5B illustrate one example of the formation of a semiconductor structure 500 having a plurality of logic process-compatible devices, according to some embodiments. The logic process-compatible devices may include at least a processor, an array of RAM cells, and peripheral circuits. Semiconductor structure 500 may be the same as or similar to first semiconductor structure 202 of FIG. 2A and second semiconductor structure 204 of FIG. 2B. In some embodiments, semiconductor structure 500 is formed before the bonding process.

As illustrated in FIG. 5A, a plurality of transistors 504 are formed on a silicon substrate 502 (e.g., a silicon wafer). Transistors 504 can be formed by a plurality of processes including, but not limited to, photolithography, dry/wet etch, thin film deposition, thermal growth, implantation, chemical mechanical polishing (CMP), and any other suitable processes. In some embodiments, doped regions are formed in silicon substrate 502 by ion implantation and/or thermal diffusion, which function, for example, as source regions and/or drain regions of transistors 504. In some embodiments, isolation regions (e.g., STIs) are also formed in silicon substrate 502 by wet/dry etch and thin film deposition. Transistors 504 can form a device layer 506 on silicon substrate 502. In some embodiments, device layer 506 includes a processor 508, an array of RAM cells 510, and a peripheral circuit 512.

An interconnect layer is formed above the processor and the array of RAM cells. The interconnect layer can include a plurality of interconnects in one or more ILD layers. As illustrated in FIG. 5B, an interconnect layer 514 can be formed above device layer 506 including processor 508 and array of RAM cells 510. Interconnect layer 514 can include interconnects of MEOL and/or BEOL in a plurality of ILD layers to make electrical connections with device layer 506. In some embodiments, interconnect layer 514 includes multiple ILD layers and interconnects therein formed in multiple processes. For example, the interconnects in interconnect layers 514 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 5B can be collectively referred to as interconnect layer 514.

A bonding layer is formed above the interconnect layer. The bonding layer can include a plurality of bonding contacts. As illustrated in FIG. 5B, a bonding layer 516 is formed above interconnect layer 514. Bonding layer 516 can include a plurality of bonding contacts 518 surrounded by dielectrics. In some embodiments, a dielectric layer is deposited on the top surface of interconnect layer 514 by one or more thin film deposition processes including, but not limited to, CVD, PVD, ALD, or any combination thereof. Bonding contacts 518 then can be formed through the dielectric layer and in contact with the interconnects in interconnect layer 514 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor. In some embodiments, bonding contacts 518 are disposed at and/or exposed by the upper surface of bonding layer 516. Semiconductor structure 500 may thus be formed.

Figure 9:
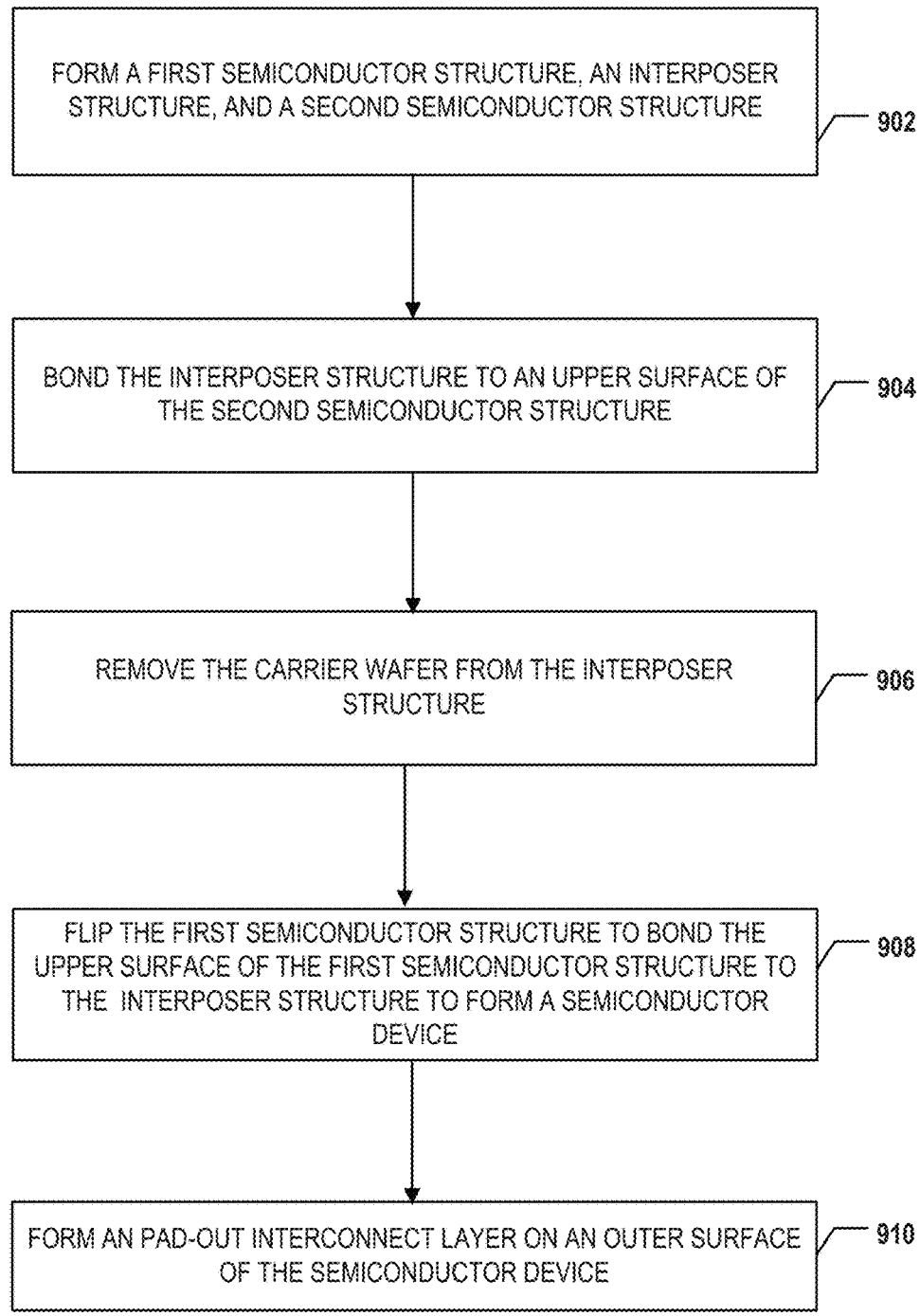
FIG. 9 illustrates a flowchart of an exemplary fabrication process for forming a semiconductor device, according to some embodiments.

FIG. 9 illustrates a flowchart of a method 900 for bonding a pair of semiconductor structures with an interposer structure, according to some embodiments. FIGS. 6A-6D and 7A-7D illustrate the bonding processes to form a semiconductor device of different structures using method 900. For ease of illustration, the bonding processes depicted in FIGS. 6A-6D and 7A-7D are described together. It is understood that the operations shown in method 900 are not exhaustive and that other operations can be performed as well before, after, or between any of the illustrated operations. Further, some of the operations may be performed simultaneously, or in a different order than shown in FIG. 9.

Referring to FIG. 9, method 900 starts at operation 902, in which a first semiconductor structure, an interposer structure, and a second semiconductor structure are formed. FIGS. 3B, 4B, and 5B illustrate corresponding structures 300, 416, and 500.

As shown in FIGS. 3B, 4B, and 5B, semiconductor structures 300 and 500, and interposer structure 416 are formed before the bonding process. Semiconductor structures 300 and 500 may be respectively used as a first semiconductor structure and a second semiconductor structure in one bonding process, or a second semiconductor structure and a first semiconductor structure in another bonding process. Interposer structure 416 may be the same as or similar to interposer structures 106 in FIGS. 1 and 2.

Referring back to FIG. 9, after the formation of first and second semiconductor structures and the interposer structure, method 900 proceeds to operation 904, in which the interposer structure is bonded to the upper surface of the second semiconductor structure. FIGS. 6A, 6B, 7A, and 7B illustrate corresponding structures.

Figure 6A:
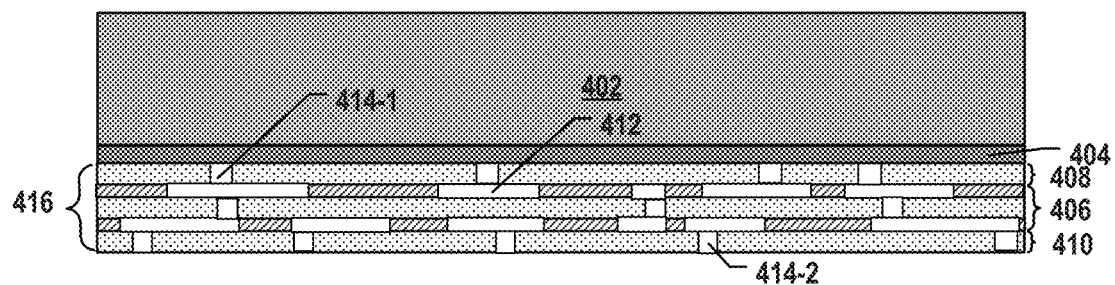
FIGS. 6A-6D illustrate a fabrication process for forming an exemplary semiconductor device, according to some embodiments.
Figure 6A:
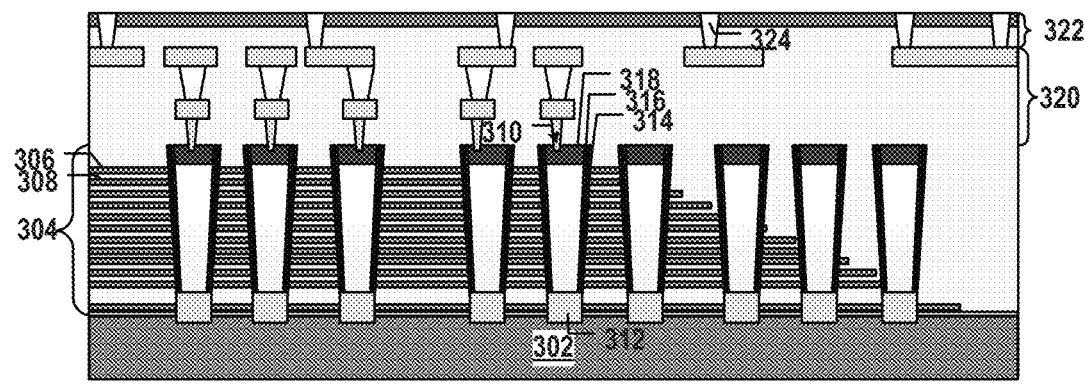
Figure 6B:
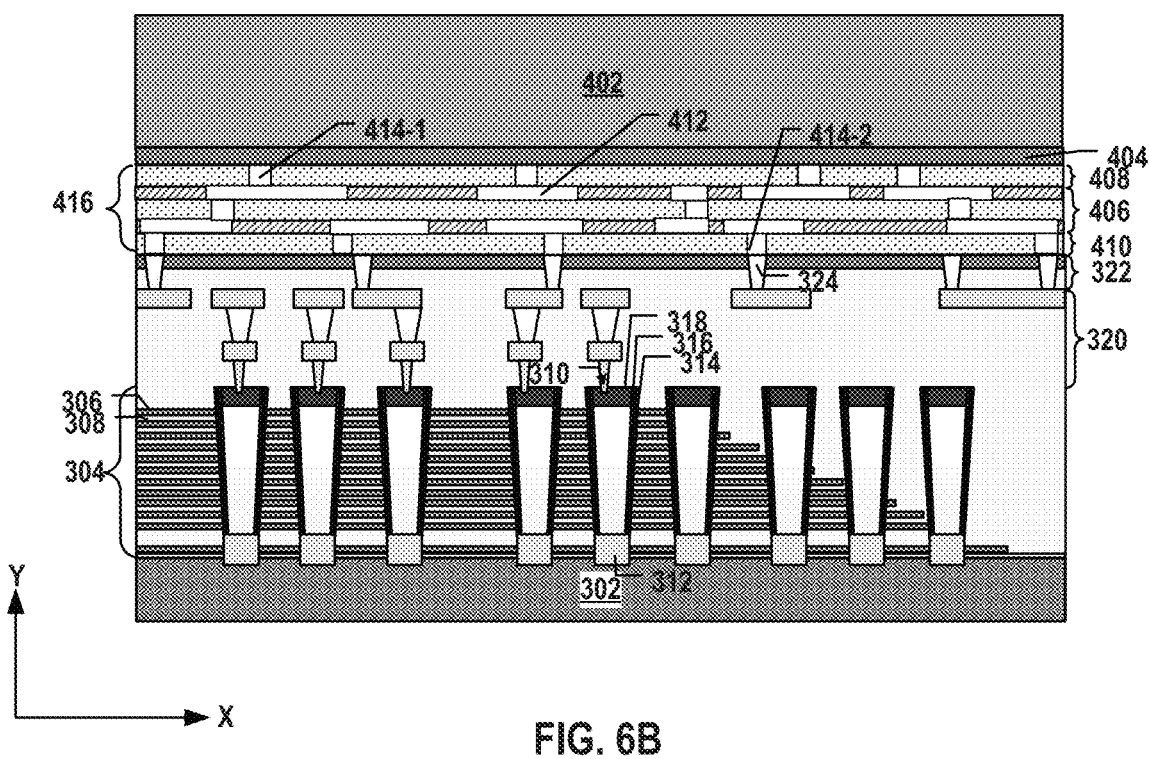

As shown in FIGS. 6A and 6B, semiconductor structure 300 may be employed as the second semiconductor structure, and interposer structure 416 may be flipped upside down to be aligned and attached/bonded to the upper surface of semiconductor structure 300. Second interposer bonding layer 410 may be attached/bonded to bonding layer 322 (or dielectrics in bonding layer 322), and second interposer contacts 414-2 may be in contact with and conductively connected to bonding contacts 324.

Figure 7A:
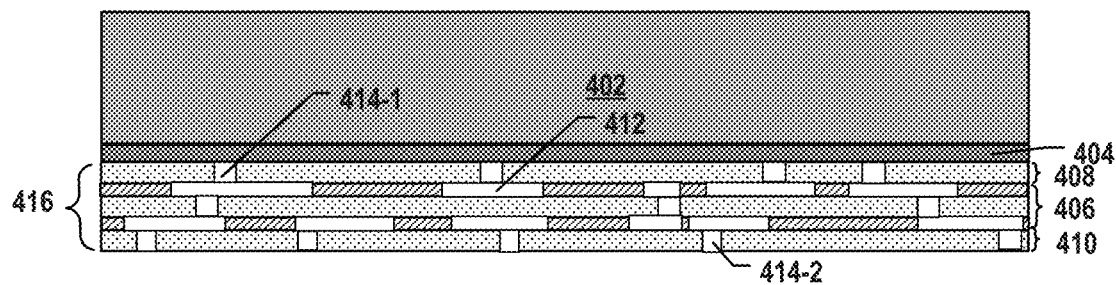
FIGS. 7A-7D illustrate a fabrication process for forming another exemplary semiconductor device, according to some embodiments.
Figure 7A:
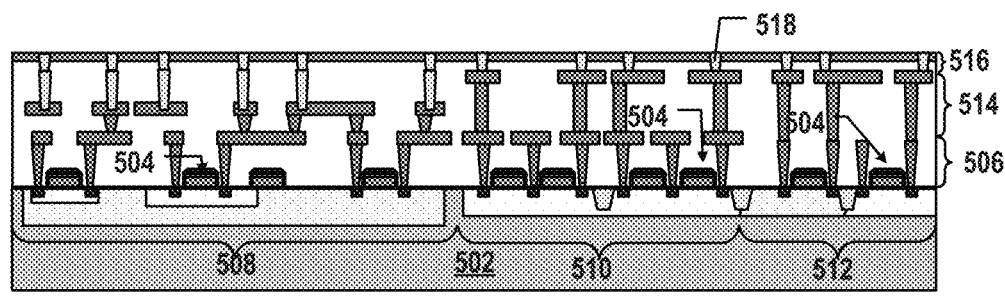
Figure 7A:
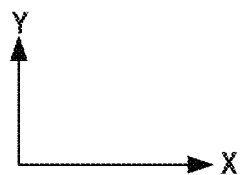
Figure 7B:
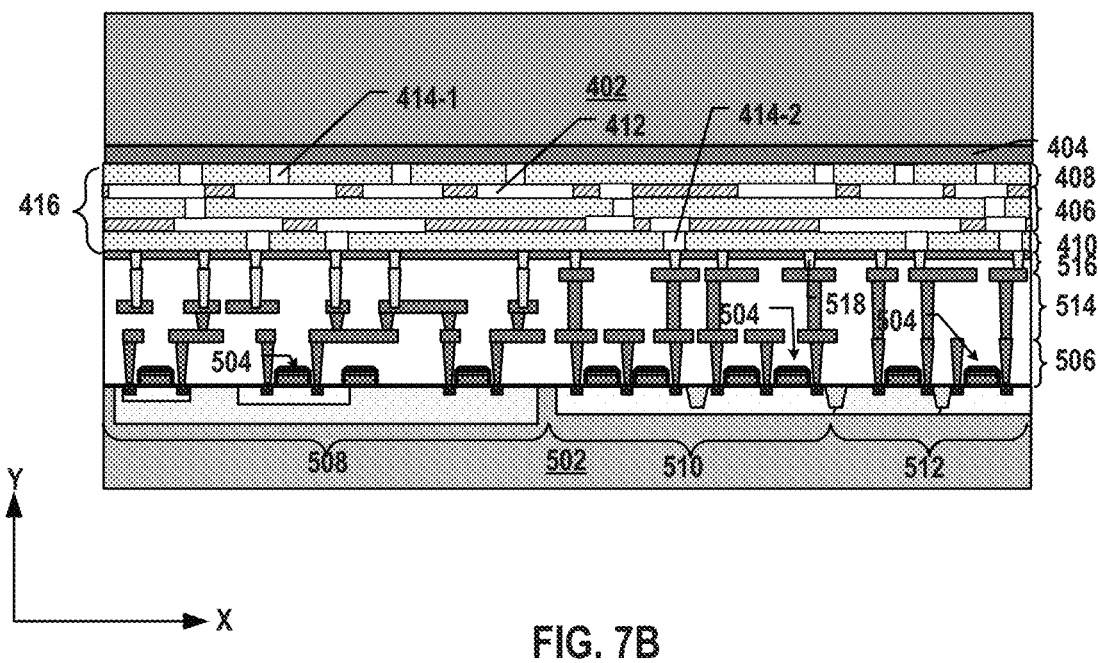

Similarly, as shown in FIGS. 7A and 7B, semiconductor structure 500 may be employed as the second semiconductor structure, and interposer structure 416 may be flipped upside down to be aligned and attached/bonded to the upper surface of semiconductor structure 500. Second interposer bonding layer 410 may be attached/bonded to bonding layer 516 (or dielectrics in bonding layer 516), and second interposer contacts 414-2 may be in contact with and conductively connected to bonding contacts 518.

Figure 6C:
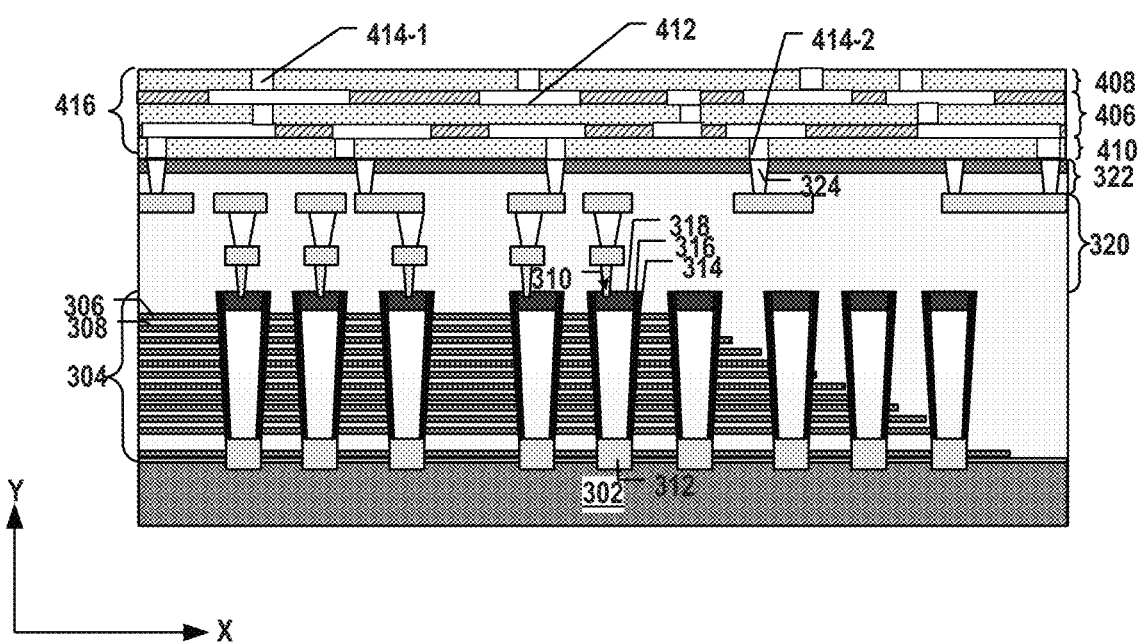
Figure 7C:
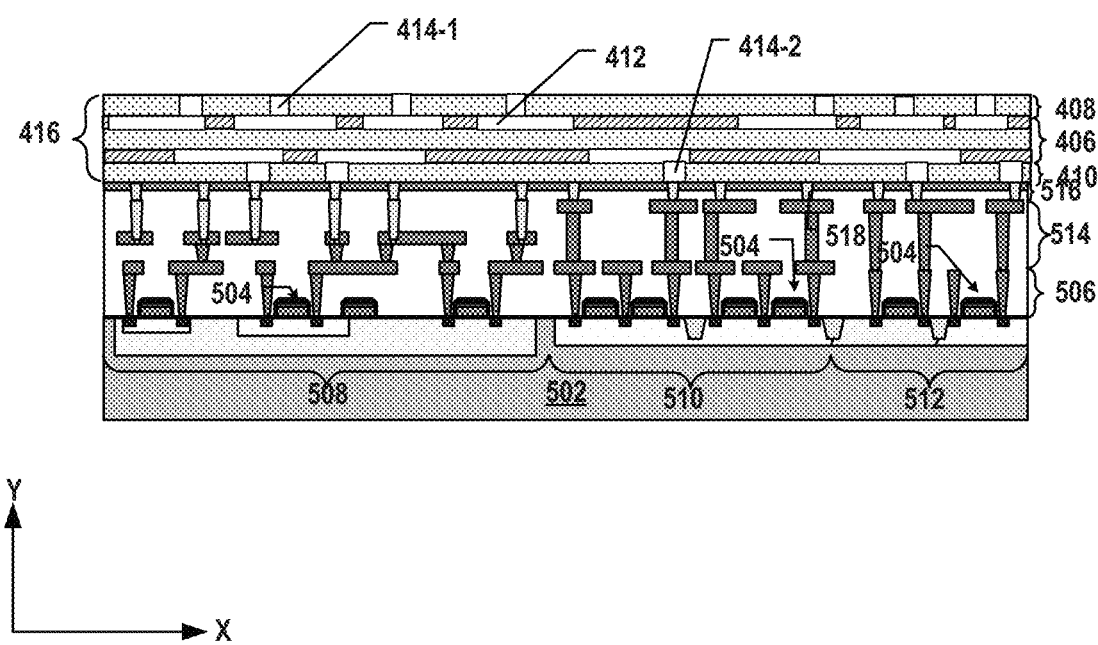

Referring back to FIG. 9, after bonding the interposer structure with the second semiconductor structure, method 900 proceeds to operation 906, in which the carrier wafer is removed from the interposer structure. FIGS. 6C and 7C illustrate corresponding structures.

As shown in FIGS. 6C and 7C, carrier wafer 402 and releasing layer 404 (if any) may be removed from interposer structure 416. Carrier wafer 402 may be removed by any suitable methods such as recess etching the interface between interposer structure 416 and carrier wafer 402 and/or applying a force to remove carrier wafer 402. In some embodiments, a suitable etchant and/or solution is used to remove/debond releasing layer 404 from interposer structure 416. First interposer contacts 414-1 may be exposed after the removal of carrier wafer 402 and/or releasing layer 404.

Figure 6D:
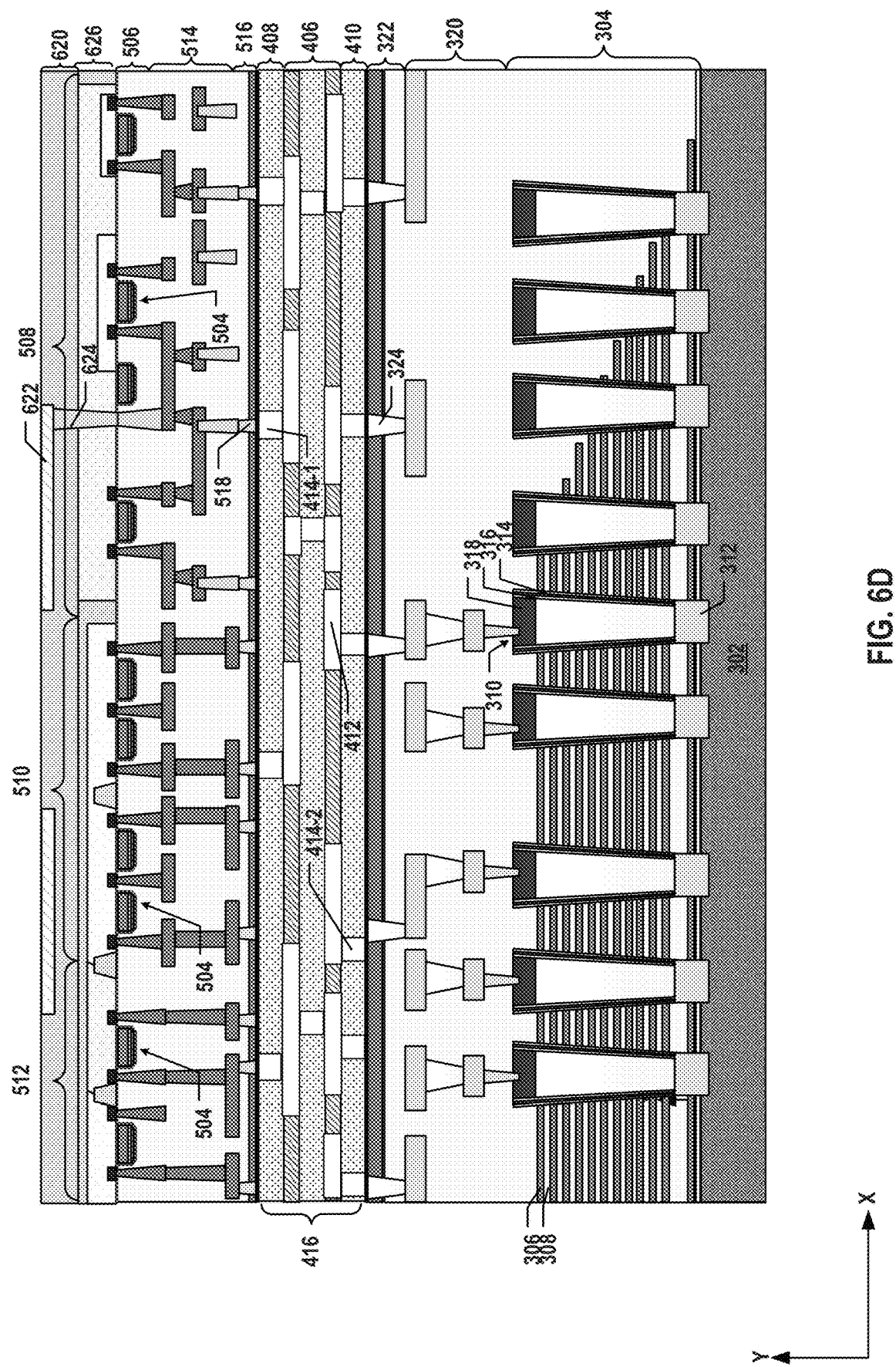
Figure 7D:
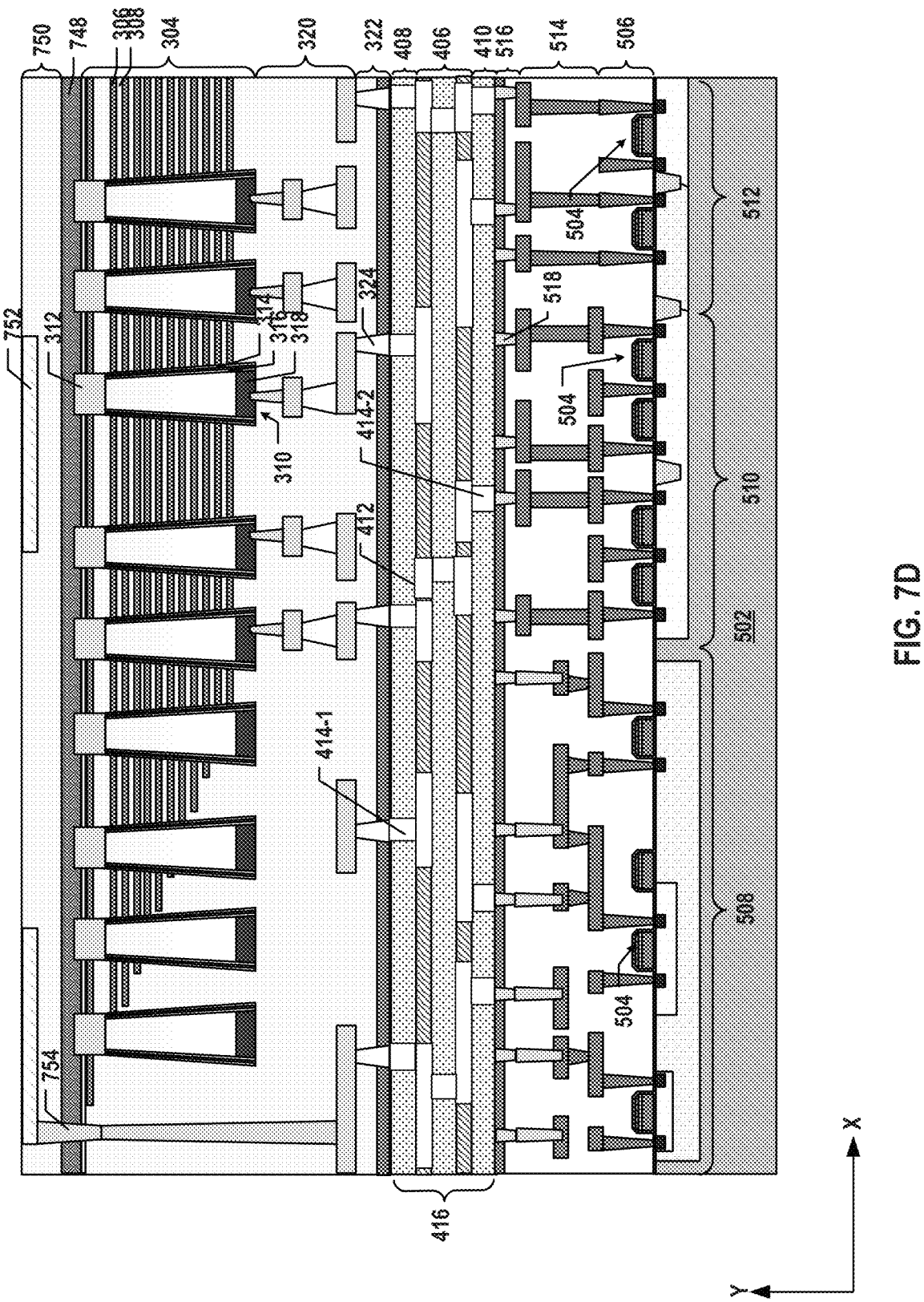

Referring back to FIG. 9, after removing the carrier wafer, method 900 proceeds to operation 908, in which the first semiconductor structure is flipped so the upper surface of the first semiconductor structure is bonded to the interposer structure to form a semiconductor device. FIGS. 6D and 7D illustrate corresponding structures.

As shown in FIG. 6D, semiconductor structure 500 may be employed as the first semiconductor structure and flipped upside down to be aligned and attached/bonded to interposer structure 416. First interposer bonding layer 408 may be attached/bonded to bonding layer 516 (or dielectrics in bonding layer 516), and first interposer contacts 414-1 may be in contact with and conductively connected to bonding contacts 518.

Similarly, As shown in FIG. 7D, semiconductor structure 300 may be employed as the first semiconductor structure and flipped upside down to be aligned and attached/bonded to interposer structure 416. First interposer bonding layer 408 may be attached/bonded to bonding layer 322 (or dielectrics in bonding layer 322), and first interposer contacts 414-1 may be in contact with and conductively connected to bonding contacts 324. In both of FIGS. 6D and 7D, the first and second semiconductor structures are bonded in a face-to-face manner to form a semiconductor device.

Referring back to FIG. 9, after the formation of the semiconductor device, method 900 proceeds to operation 910, in which a pad-out interconnect layer is formed on an outer surface of the semiconductor device. FIGS. 6D and 7D illustrate corresponding structures.

The substrate of the semiconductor structure above interposer structure 416 may be thinned. As illustrated in FIG. 6D, silicon substrate 502 at the top of the semiconductor device (e.g., a bonded chip) is thinned, so that the thinned top substrate can serve as a semiconductor layer 626, for example, a single-crystal silicon layer or a polysilicon layer. Similarly, as illustrated in FIG. 7D, silicon substrate 302 at the top of the semiconductor device is thinned, so that the thinned top substrate can serve as a semiconductor layer 748, for example, a single-crystal silicon layer. The thickness of the thinned substrate can be between about 200 nm and about 5 µm, such as between 200 nm and 5 µm, or between about 150 nm and about 50 µm, such as between 150 nm and 50 µm. The substrate can be thinned by processes including, but not limited to, wafer grinding, dry etch, wet etch, CMP, any other suitable processes, or any combination thereof.

A pad-out interconnect layer is formed above the semiconductor layer. As illustrated in FIG. 6D, a pad-out interconnect layer 620 is formed above semiconductor layer 626 (the thinned top substrate). Pad-out interconnect layer 620 can include interconnects, such as pad contacts 622, formed in one or more ILD layers. Pad contacts 622 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 624 are formed extending vertically through semiconductor layer 626, for example by wet/dry etch followed by depositing conductive materials. Contacts 624 can be in contact with the interconnects in pad-out interconnect layer 620.

Similarly, as illustrated in FIG. 7D, a pad-out interconnect layer 750 is formed above semiconductor layer 748 (the thinned top substrate). Pad-out interconnect layer 750 can include interconnects, such as pad contacts 752, formed in one or more ILD layers. Pad contacts 752 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 754 are formed extending vertically through semiconductor layer 748, for example by wet/dry etch followed by depositing conductive materials. Contacts 754 can be in contact with the interconnects in pad-out interconnect layer 750.

According to some embodiments of the present disclosure, a semiconductor device includes a first semiconductor structure, a second semiconductor structure, and an interposer structure vertically between the first and second semiconductor structures. The first semiconductor structure includes a plurality of logic process-compatible devices and a first bonding layer comprising a plurality of first bonding contacts. The second semiconductor structure includes an array of NAND memory cells and a second bonding layer comprising a plurality of second bonding contacts. The interposer structure includes a first interposer bonding layer having a plurality of first interposer contacts disposed at a first side of the interposer structure, and a second interposer bonding layer having a plurality of second interposer contacts disposed at a second side opposite of the first side of the interposer structure. The plurality of first interposer contacts is conductively connected to the plurality of second interposer contacts. The interposer structure is attached to the first semiconductor structure through the first interposer bonding layer and is conductively connected to the first semiconductor structure through the first bonding contacts and the first interposer contacts. The interposer structure is attached to the second semiconductor structure through the second interposer bonding layer and is conductively connected to the second semiconductor structure through the second bonding contacts and second interposer contacts.

In some embodiments, the first interposer bonding layer and the second interposer bonding layer include an adhesive material to the first semiconductor structure and the second semiconductor structure.

In some embodiments, the semiconductor device further includes a redistribution layer between the first interposer bonding layer and the second interposing bonding layer. The redistribution layer includes the same adhesive material as the first interposer bonding layer and the second interposer bonding layer. A plurality of conductive routings of the redistribution layer are distributed in one or more levels and conductively connected to one another.

In some embodiments, the first interposer bonding layer and the second interposer bonding layer include an adhesive polymer.

In some embodiments, the first semiconductor structure is above the second semiconductor structure, and the plurality of logic process-compatible devices are above the first bonding layer.

In some embodiments, the first semiconductor structure includes a semiconductor layer above the plurality of logic process-compatible devices, and the second semiconductor structure includes a substrate under the array of NAND memory cells.

In some embodiments, the second semiconductor structure is above the first semiconductor structure, and the array of NAND memory cells is above the second bonding layer.

In some embodiments, the second semiconductor structure includes a semiconductor layer above the array of NAND memory cells, and the first semiconductor structure includes a substrate under the plurality of logic process-compatible devices.

In some embodiments, the semiconductor device further includes a pad-out interconnect layer above the semiconductor layer.

In some embodiments, the semiconductor layer includes single-crystalline silicon.

In some embodiments, the first semiconductor structure includes a first interconnect layer between and conductively connecting the plurality of logic process-compatible devices and the plurality of first bonding contacts. In some embodiments, the second semiconductor structure includes a second interconnect layer between and conductively connecting the array of NAND memory cells and the plurality of second bonding contacts.

In some embodiments, the plurality of logic process-compatible devices are conductively connected to the array of NAND memory cells through the first and second interconnect layers and the first and second bonding contacts.

In some embodiments, the plurality of logic process-compatible devices include at least one of a processor, an array of random-access memory (RAM) cells, or a peripheral circuit of the array of NAND memory cells.

In some embodiments, the array of RAM cells and the processor are conductively connected to the array of NAND memory cells through the first and second interconnect layers and the first and second bonding contacts.

In some embodiments, the array of NAND memory cells comprises at least one of an array of 2D NAND memory cells or an array of 3D NAND memory cells.

According to some embodiments of the present disclosure, a semiconductor device includes a first semiconductor structure, a second semiconductor structure, and an interposer structure. The first semiconductor structure includes a first device layer and a first bonding layer comprising a plurality of first bonding contacts. The second semiconductor structure includes a second device layer and a second bonding layer comprising a plurality of second bonding contacts. The interposer structure includes a redistribution layer, a first interposer bonding layer, and a second interposer bonding layer. The redistribution layer includes a plurality of conductive routings distributed in one or more levels. The first interposer bonding layer includes a plurality of first interposer contacts disposed at a first side of the redistribution layer. The second interposer bonding layer includes a plurality of second interposer contacts disposed at a second side opposite of the first side of the redistribution layer. The first interposer contacts is conductively connected to the second interposer contacts through the conductive routings. The interposer structure is attached to the first semiconductor structure through the first interposer bonding layer and is conductively connected to the first semiconductor structure through the first bonding contacts and the first interposer contacts. The interposer structure is attached to the second semiconductor structure through the second interposer bonding layer and is conductively connected to the second semiconductor structure through the second bonding contacts and the second interposer contacts.

In some embodiments, the first interposer bonding layer, the second interposer bonding layer, and the redistribution layer include a same adhesive material to the first semiconductor structure and the second semiconductor structure.

In some embodiments, the same adhesive material includes an adhesive polymer.

In some embodiments, the first semiconductor structure is above the second semiconductor structure, and the first device layer is above the first bonding layer.

In some embodiments, the first semiconductor structure includes a semiconductor layer above the first device layer, and the second semiconductor structure includes a substrate under the second device layer.

In some embodiments, the second semiconductor structure is above the first semiconductor structure, and the second device layer is above the second bonding layer.

In some embodiments, the second semiconductor structure includes a semiconductor layer above the second device layer, and the first semiconductor structure includes a substrate under the first device layer.

In some embodiments, the semiconductor device further includes a pad-out interconnect layer above the semiconductor layer.

In some embodiments, the semiconductor layer includes single-crystalline silicon.

In some embodiments, the first semiconductor structure includes a first interconnect layer between and conductively connecting the first device layer and the plurality of first bonding contacts. In some embodiments, the second semiconductor structure includes a second interconnect layer between and conductively connecting the second device layer and the plurality of second bonding contacts.

In some embodiments, the first device layer are conductively connected to the second device layer through the first and second interconnect layers and the first and second bonding contacts.

In some embodiments, the first device layer includes at least one of a processor, an array of RAM cells, or a peripheral circuit of the array of the second device layer.

In some embodiments, the array of RAM cells and the processor are conductively connected to the second device layer through the first and second interconnect layers and the first and second bonding contacts.

In some embodiments, the second device layer includes at least one of an array of 2D NAND memory cells or an array of 3D NAND memory cells.

According to some embodiments of the present disclosure, a method for forming a 3D memory devices includes the following operations. First, in a first semiconductor structure, a plurality of logic process-compatible devices and a plurality of first bonding contacts are formed conductively connected to the plurality of logic process-compatible devices. In a second semiconductor structure, an array of NAND memory cells and a plurality of second bonding contacts are formed conductively connected to the array of NAND memory cells. A first surface of an interposer structure is bonded to the second semiconductor structure. A plurality of first interposer contacts disposed at the first surface of the interposer structure are conductively connected to the plurality of second bonding contacts. A second surface of the interposer structure is bonded to the first semiconductor structure. A plurality of second interposer contacts disposed at the second surface of the interposer structure are conductively connected to the plurality of first bonding contacts. The interposer structure is attached to the first semiconductor structure and the second semiconductor structure.

In some embodiments, the method further includes forming the interposer structure before bonding the interposer structure to the first and the second semiconductor structures. A formation of the interposer includes forming a first interposer bonding layer on a carrier wafer and the plurality of first interposer contacts in the first interposer bonding layer, forming a redistribution layer on the first interposer bonding layer and conductively connected to the plurality of first interposer contacts, and forming a second interposer bonding layer on the redistribution layer and the plurality of second interposer contacts in the second interposer bonding, the plurality of second interposer contacts being conductively connected to the redistribution layer.

In some embodiments, the method further includes forming a releasing layer between the interposer structure and the carrier wafer, and removing the carrier wafer through the releasing layer after bonding the interposer structure to the second semiconductor structure.

In some embodiments, forming the redistribution layer includes forming a plurality of conductive routings distributed one or more levels in a layer of dielectric material.

In some embodiments, the method includes debonding the releasing layer from the second side of the interposer structure.

In some embodiments, forming the plurality logic process-compatible devices include forming at least one of a processor, an array of random-access memory (RAM) cells, or a peripheral circuit of an array of NAND memory cells.

In some embodiments, forming the NAND memory cells comprises forming a memory stack and a memory string extending vertically through the memory stack.

In some embodiments, the method further includes forming a first interconnect layer between and conductively connected to the plurality of logic process-compatible devices and the plurality of first bonding contacts and forming a second interconnect layer between and conductively connected to the array of NAND memory cells and the plurality of second bonding contacts.

In some embodiments, the method further includes, in response to the first semiconductor structure being above the second semiconductor structure, thinning a side of the first semiconductor structure that is opposite of the plurality of first bonding contacts to form a semiconductor layer and a pad-out interconnect layer above the semiconductor layer. In some embodiments, method further includes, in response to the second semiconductor structure being above the first semiconductor structure, thinning a side of the second semiconductor structure that is opposite of the plurality of second bonding contacts to form a semiconductor layer and a pad-out interconnect layer above the semiconductor layer.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming, in a first semiconductor structure, a plurality of logic process-compatible devices and a plurality of first bonding contacts conductively connected to the plurality of logic process-compatible devices;
    forming, in a second semiconductor structure, an array of NAND memory cells and a plurality of second bonding contacts conductively connected to the array of NAND memory cells;
    preparing an interposer structure on a carrier wafer;
    after forming the second semiconductor structure, bonding a first surface of the interposer structure opposite to the carrier wafer to the second semiconductor structure, a plurality of first interposer contacts disposed at the first surface of the interposer structure being conductively connected to the plurality of second bonding contacts; and
    after removing the carrier wafer from the bonded second semiconductor structure and the interposer structure, bonding a second surface of the interposer structure to the first semiconductor structure, a plurality of second interposer contacts disposed at the second surface of the interposer structure being conductively connected to the plurality of first bonding contacts, wherein the interposer structure is attached to the first semiconductor structure and the second semiconductor structure.

2. The method of claim 1, further comprising forming the interposer structure before bonding the interposer structure to the first and the second semiconductor structures, wherein a formation of the interposer structure comprises:
    forming a first interposer bonding layer on the carrier wafer and the plurality of first interposer contacts in the first interposer bonding layer;
    forming a redistribution layer on the first interposer bonding layer and conductively connected to the plurality of first interposer contacts; and
    forming a second interposer bonding layer on the redistribution layer and the plurality of second interposer contacts in the second interposer bonding layer, the plurality of second interposer contacts being conductively connected to the redistribution layer.

3. The method of claim 2, further comprising:
    forming a releasing layer between the interposer structure and the carrier wafer; and
    after bonding the interposer structure to the second semiconductor structure, removing the carrier wafer through the releasing layer by debonding the releasing layer from a side of the interposer structure close to the releasing layer.

4. The method of claim 3, wherein forming the redistribution layer comprises forming a plurality of conductive routings distributed one or more levels in a layer of dielectric material.

5. The method of claim 3, further comprising debonding the releasing layer from the side of the interposer structure.

6. The method of claim 1, wherein forming the plurality of logic process-compatible devices comprises forming at least one of a processor, an array of random-access memory (RAM) cells, or a peripheral circuit of an array of NAND memory cells.

7. The method of claim 6, wherein forming the NAND memory cells comprises forming a memory stack and a memory string extending vertically through the memory stack.

8. The method of claim 2, further comprising:
    forming a first interconnect layer between and conductively connected to the plurality of logic process-compatible devices and the plurality of first bonding contacts; and
    forming a second interconnect layer between and conductively connected to the array of NAND memory cells and the plurality of second bonding contacts.

9. The method of claim 2, further comprising:
    when the first semiconductor structure is above the second semiconductor structure, thinning a side of the first semiconductor structure that is opposite of the plurality of first bonding contacts to form a semiconductor layer and a pad-out interconnect layer above the semiconductor layer; and
    when the second semiconductor structure is above the first semiconductor structure, thinning a side of the second semiconductor structure that is opposite of the plurality of second bonding contacts to form a semiconductor layer and a pad-out interconnect layer above the semiconductor layer.

10. The method of claim 1, wherein forming the first semiconductor structure comprises forming the first semiconductor structure separately from the interposer structure.

11. The method of claim 1, wherein forming the second semiconductor structure comprises forming the second semiconductor structure separately from the interposer structure.

12. The method of claim 1, wherein forming the first semiconductor structure, forming the second semiconductor structure, and preparing the interposer structure comprise, before bonding the first surface of the interposer structure opposite to the carrier wafer to the second semiconductor structure, forming the first semiconductor structure, forming the second semiconductor structure, and preparing the interposer structure, independently from one another.

13. A method for forming a three-dimensional (3D) memory device, comprising:
    forming a first semiconductor structure comprising a first semiconductor component and a plurality of first bonding contacts coupled to the first semiconductor component;
    forming a second semiconductor structure comprising a second semiconductor component and a plurality of second bonding contacts coupled to the second semiconductor component;
    preparing an interposer structure on a carrier wafer, the interposer structure comprising a plurality of first interposer contacts on a first surface of the interposer structure;
    after forming the first semiconductor structure, bonding the first semiconductor structure to the first surface of the interposer structure that is arranged on the carrier wafer to form a third semiconductor structure comprising the carrier wafer at one side of the interposer structure and the first semiconductor structure at another side of the interposer structure, the first surface of the interposer structure on the carrier wafer being a flat surface, and the first interposer contacts being in contact with the first bonding contacts;

removing the carrier wafer from the third semiconductor structure to expose a second surface of the interposer structure having a plurality of second interposer contacts; and bonding the second semiconductor structure to the second surface of the interposer structure, the second interposer contacts being in contact with the second bonding contacts.

14. The method of claim 13, wherein the first semiconductor structure, the second semiconductor structure, and the interposer structure are formed and prepared separately from one another.

15. The method of claim 13, wherein:

the first semiconductor component comprises a plurality of logic process-compatible devices; and the second semiconductor component comprises an array of NAND memory cells.

16. The method of claim 13, wherein:

the first semiconductor component comprises an array of NAND memory cells; and the second semiconductor component comprises a plurality of logic process-compatible devices.

17. The method of claim 13, wherein:

forming the first semiconductor structure comprises forming the first semiconductor structure on a first substrate; and bonding the first semiconductor structure to the first surface of the interposer structure comprises bonding the first semiconductor structure on the first substrate to the first surface of the interposer structure on the carrier wafer.

18. The method of claim 17, wherein:

forming the second semiconductor structure comprises forming the second semiconductor structure on a second substrate; and bonding the second semiconductor structure to the second surface of the interposer structure comprises bonding the second semiconductor structure on the second substrate to the second surface of the interposer structure.

19. The method of claim 18, further comprising:

thinning the first substrate to form a semiconductor layer, and forming a pad-out interconnect layer above the semiconductor layer.

20. The method of claim 18, further comprising:

thinning the second substrate to form a semiconductor layer, and forming a pad-out interconnect layer above the semiconductor layer.

* * * * *